(12) United States Patent
Park

(10) Patent No.: US 10,062,581 B2
(45) Date of Patent: Aug. 28, 2018

(54) METHODS OF FORMING AN ISOLATION STRUCTURE AND METHODS OF MANUFACTURING A SEMICONDUCTOR DEVICE INCLUDING THE SAME

(71) Applicant: Samsung Electronics Co., Ltd., Suwon-si (KR)

(72) Inventor: Seok-Han Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 15/091,917

(22) Filed: Apr. 6, 2016

(65) Prior Publication Data

US 2017/0012098 A1    Jan. 12, 2017

(30) Foreign Application Priority Data

Jul. 9, 2015  (KR) .................. 10-2015-0097610

(51) Int. Cl.
*H01L 21/324* (2006.01)
*H01L 21/762* (2006.01)
(Continued)

(52) U.S. Cl.
CPC ...... *H01L 21/324* (2013.01); *H01L 21/76229* (2013.01); *H01L 21/76232* (2013.01);
(Continued)

(58) Field of Classification Search
CPC ............. H01L 21/022; H01L 21/02222; H01L 21/02326; H01L 21/3086; H01L 21/32105;
(Continued)

(56) References Cited

U.S. PATENT DOCUMENTS 4,671,970 A    6/1987  Keiser et al.
5,930,646 A    7/1999  Gerung et al.
(Continued)

FOREIGN PATENT DOCUMENTS

JP    2000269317    9/2000
JP    2013239569    11/2013
(Continued)

*Primary Examiner* — Bilkis Jahan
*Assistant Examiner* — Victor Barzykin
(74) *Attorney, Agent, or Firm* — Onello & Mello, LLP

(57) ABSTRACT

A method of forming an isolation structure, wherein a hard mask is formed on a first region and a second region of a substrate; the substrate is etched using the hard mask as an etching mask to form a plurality of first active patterns in the first region and a plurality of second active patterns in the second region, a first trench between the first active patterns having a first trench width, and a second trench between the second active patterns having a second trench width smaller than the first trench width; a first oxide layer is formed on the hard mask and the first and second trenches; the first oxide layer is conformally formed on an inner wall of the first trench and filling the second trench; a polysilicon layer is conformally formed on the first oxide layer and a spin-on-dielectric (SOD) layer is formed on the polysilicon layer to fill the first trench; and the SOD layer and the polysilicon layer are annealed using an oxygen-containing gas so that the SOD layer and the polysilicon layer are transformed into a second oxide layer and a third oxide layer, respectively, in the first trench, resulting in a semiconductor device with an isolation structure with good isolation characteristics.

15 Claims, 30 Drawing Sheets

(51) Int. Cl.
*H01L 27/108* (2006.01)
*H01L 21/02* (2006.01)
*H01L 21/308* (2006.01)
*H01L 21/321* (2006.01)

(52) U.S. Cl.
CPC .. *H01L 27/10805* (2013.01); *H01L 27/10897* (2013.01); *H01L 21/022* (2013.01); *H01L 21/02222* (2013.01); *H01L 21/02326* (2013.01); *H01L 21/3086* (2013.01); *H01L 21/32105* (2013.01)

(58) Field of Classification Search
CPC ............. H01L 21/324; H01L 21/76229; H01L 21/76232
See application file for complete search history.

(56) References Cited

U.S. PATENT DOCUMENTS

| | | | |
|---|---|---|---|
| 6,015,757 A * | 1/2000 | Tsai | H01L 21/31053 257/E21.244 |
| 6,200,881 B1 | 3/2001 | Lou | |
| 6,468,853 B1 | 10/2002 | Balasubramanian et al. | |
| 6,475,875 B1 | 11/2002 | Hau et al. | |
| 6,649,488 B2 | 11/2003 | Lee et al. | |
| 8,304,322 B2 | 11/2012 | Rudeck et al. | |
| 8,399,363 B1 * | 3/2013 | Lee | H01L 21/76229 438/427 |
| 2013/0052795 A1 * | 2/2013 | Watanabe | H01L 21/76229 438/427 |
| 2013/0241027 A1 * | 9/2013 | Kwak | H01L 29/0649 257/506 |
| 2014/0159193 A1 * | 6/2014 | Kim | H01L 29/0649 257/513 |
| 2014/0312409 A1 | 10/2014 | Thurgate et al. | |

FOREIGN PATENT DOCUMENTS

| | | |
|---|---|---|
| KR | 100174493 | 11/1998 |
| KR | 100223276 | 7/1999 |
| KR | 0564550 | 1/2001 |
| KR | 1020010038197 | 5/2001 |
| KR | 0564561 | 8/2001 |
| KR | 0455093 | 7/2004 |
| KR | 1020060102918 | 9/2006 |
| KR | 1020080084256 | 9/2008 |
| KR | 1020120090544 | 8/2012 |

* cited by examiner

SECOND REGION

FIRST REGION

SECOND REGION

FIRST REGION

METHODS OF FORMING AN ISOLATION STRUCTURE AND METHODS OF MANUFACTURING A SEMICONDUCTOR DEVICE INCLUDING THE SAME

CROSS-REFERENCE TO RELATED APPLICATION

This application claims priority under 35 USC § 119 to Korean Patent Application No. 10-2015-0097610, filed on Jul. 9, 2015 in the Korean Intellectual Property Office (KIPO), the contents of which are herein incorporated by reference in their entirety.

TECHNICAL FIELD

Exemplary embodiments relate to methods of forming an isolation structure and methods of manufacturing a semiconductor device including the same.

BACKGROUND

When a semiconductor device is manufactured, a shallow trench isolation (STI) process may be performed on a substrate to form active patterns and isolation patterns. A plurality of trenches between the active patterns may have different widths from each other according to their positions in the substrate. The isolation patterns in the trenches having the various widths need to have good isolation characteristics.

SUMMARY

Exemplary embodiments provide a method of forming an isolation structure having good isolation characteristics.

Exemplary embodiments provide a method of manufacturing a semiconductor device including an isolation structure having good isolation characteristics.

According to exemplary embodiments, there is provided a method of an isolation structure. In the method, a hard mask is formed on a first region and a second region of a substrate. The substrate is etched using the hard mask as an etching mask to form a plurality of first active patterns in the first region and a plurality of second active patterns in the second region, a first trench between the first active patterns having a first width, and a second trench between the second active patterns having a second width smaller than the first width. A first oxide layer is formed on the hard mask and the first and second first trenches. The first oxide layer is conformally formed on an inner wall of the first trench and filling the second trench. A polysilicon layer is conformally formed on the first oxide layer. A spin-on-dielectric (SOD) layer is formed on the polysilicon layer to fill the first trench. The SOD layer and the polysilicon layer are annealed using an oxygen-containing gas so that the SOD layer and the polysilicon layer are transformed into a second oxide layer and a third oxide layer, respectively, in the first trench.

In exemplary embodiments, the SOD layer may be formed by spin coating polysilazane based solution.

In exemplary embodiments, the first oxide layer may include silicon oxide formed by a chemical vapor deposition (CVD) process, an atomic layer deposition (ALD) process or a thermal oxidation process.

In exemplary embodiments, the hard mask may be formed of silicon oxide.

In exemplary embodiments, a pad insulation layer and a stop layer may be further formed between the substrate and the hard mask. The pad insulation layer and the stop layer may be etched to form a pad insulation pattern and a stop pattern, respectively.

In exemplary embodiments, after forming the second oxide layer and the third oxide layer, the first oxide layer, the second oxide layer, the third oxide layer and the hard mask may be planarized until the stop layer may be exposed to form a first oxide pattern, a second oxide pattern and a third oxide pattern in the first trench and the first oxide pattern in the second trench.

In exemplary embodiments, the pad insulation layer may include silicon oxide, and the stop layer may include silicon nitride or silicon oxynitride.

In exemplary embodiments, a third trench, having a third trench width smaller than a first trench width and greater than a second trench width, is formed between the second active patterns, the third trench and the second trench being in communication with each other. In these embodiments, the first oxide layer, the polysilicon layer and the SOD layer may be further formed in the third trench.

In exemplary embodiments, a third trench, having a third trench width smaller than a first trench width and greater than a second trench width, may be formed between the second active patterns, the third trench and the second trench being in communication with each other. In these embodiments, the first oxide layer may be formed to fill the third trench.

According to exemplary embodiments, there is provided a method of forming an isolation structure. In the method, a substrate is etched to form a first trench and a second trench, the first trench having a first trench width in a first region of the substrate, the second trench having a second trench width smaller than the first trench width in a second region of the substrate. A first oxide layer is formed on the first and second trenches. The first oxide layer is conformally formed on the first trench and filling the second trench. A polysilicon layer is conformally formed on the first oxide layer. A SOD layer is formed on the polysilicon layer to fill the first trench. The SOD layer and the polysilicon layer are annealed using an oxygen-containing gas so that the SOD layer and the polysilicon layer are transformed into a second oxide layer and a third oxide layer, respectively, in the first trench. A gate structure is formed on the substrate adjacent to the first trench. A plurality of memory cells are formed on the substrate adjacent to the second trench.

In exemplary embodiments, the gate structure may extend in a direction and have a substantially uniform width along the direction.

In exemplary embodiments, after forming the second oxide layer and third oxide layer, the first oxide layer, the second oxide layer, the third oxide layer and the hard mask are planarized until a surface of the substrate is exposed to form a first oxide pattern, a second oxide pattern and a third oxide pattern in the first trench and the oxide pattern in the second trench.

In exemplary embodiments, after forming the SOD layer, the SOD layer may be planarized until a top surface of the polysilicon layer is exposed to form a SOD pattern in the first trench.

In exemplary embodiments, a third trench, having a third trench width smaller than a first trench width and greater than a second trench width, may be formed between the second active patterns. The third trench and the second trench are in communication with each other. The first oxide layer may be formed to fill the third trench.

According to exemplary embodiments, there is provided an isolation structure. The isolation structure is formed on a substrate. The substrate includes a plurality of first active patterns in a first region and a plurality of second active patterns in a second region, a first trench between the first active patterns having a first trench width, and a second trench between the second active patterns having a second trench width smaller than the first trench width. A first isolation structure including a first oxide pattern, a second oxide pattern and a third oxide pattern is formed to fill the first trench. The first, the second and the third oxide patterns are formed by different processes. A second isolation structure including a first oxide pattern is formed to fill the second trench.

In exemplary embodiments, the first and the second isolation pattern may be conformally formed on inner walls of the first trench, and the third isolation pattern may be formed to fill a remaining portion of the first trench.

In exemplary embodiments, the second oxide pattern may include silicon oxide formed by oxidizing polysilicon, and the third oxide pattern may include silicon oxide formed by annealing of a SOD layer.

In exemplary embodiments, the first oxide layer may include a silicon oxide layer formed by a CVD process, an ALD process or a thermal oxidation process.

In exemplary embodiments, the semiconductor device further comprises a gate structure extending in a direction and having a uniform width along the direction on the first active pattern.

According to exemplary embodiments, no silicon nitride liner is formed on the inner wall and the bottom of the first trench in the methods of these embodiments. The first trench may be filled with the first, the second and the third oxide patterns, and each of the first, second and third oxide patterns may include silicon oxide formed by different processes. Thus, charges trapped by the silicon nitride liner may be avoided or minimized, so that a semiconductor device including the isolation structure may have a high reliability, and a reduced incidence of operating failure.

In an aspect, embodiments of this invention include a method of manufacturing an isolation structure comprising: forming a hard mask on a first region and a second region of a substrate; etching the substrate using the hard mask as an etching mask to form a plurality of first active patterns in the first region and a plurality of second active patterns in the second region, a first trench between the first active patterns having a first trench width, and a second trench between the second active patterns having a second trench width smaller than the first trench width; forming a first oxide layer on the hard mask and on the first and second trenches, the first oxide layer being conformally formed on an inner wall of the first trench and filling the second trench; conformally forming a polysilicon layer on the first oxide layer; forming a spin-on-dielectric (SOD) layer on the polysilicon layer to fill the first trench; and forming second and third oxide layers annealing the SOD layer and the polysilicon layer using an oxygen-containing gas so that the SOD layer and the polysilicon layer are transformed into a second oxide layer and a third oxide layer, respectively, in the first trench.

In some embodiments the method includes a step of forming the SOD layer including coating with polysilazane based solution.

In some embodiments the first oxide layer includes silicon oxide formed by a chemical vapor deposition (CVD) process, an atomic layer deposition (ALD) process or a thermal oxidation process.

In some embodiments the hard mask is formed of silicon oxide.

In some embodiments the method further comprises the steps of: forming a pad insulation layer and a stop layer between the substrate and the hard mask; and etching the pad insulation layer and the stop layer to form a pad insulation pattern and a stop pattern, respectively.

In some embodiments the method further comprises, after the step of forming the second oxide layer and the third oxide layer, the step of: planarizing the first oxide layer, the second oxide layer, the third oxide layer and the hard mask until the stop layer is exposed to form a first oxide pattern, a second oxide pattern and a third oxide pattern in the first trench and to form the first oxide pattern in the second trench.

In some embodiments the pad insulation layer includes silicon oxide, and the stop layer includes silicon nitride or silicon oxynitride.

In some embodiments the method further comprises, after the step of forming the SOD layer, the step of: planarizing the SOD layer until a top surface of the polysilicon layer is exposed to form a SOD pattern in the first trench.

In some embodiments a third trench having a third trench width smaller than the first trench width and greater than the second trench width is formed between the second active patterns, the third trench and the second trench being in communication with each other, and the method also comprises: forming the first oxide layer, the polysilicon layer and the SOD layer in the third trench.

In some embodiments the method further comprises forming a third trench having a third trench width smaller than the first trench width and greater than the second trench width between the second active patterns, the third trench and the second trench being in communication with each other, and the method also comprises forming the first oxide layer to fill the third trench.

In another aspect, embodiments of this invention include a method of manufacturing a semiconductor device comprising: etching a substrate to form a first trench and a second trench, the first trench having a first trench width in a first region of the substrate, the second trench having a second trench width smaller than the first trench width in a second region of the substrate; forming a first oxide layer on the first and second trenches, the first oxide layer being conformally formed on the first trench and filling the second trench; conformally forming a polysilicon layer on the first oxide layer; forming a SOD layer on the polysilicon layer to fill the first trench; annealing the SOD layer and the polysilicon layer using an oxygen-containing gas so that the SOD layer and the polysilicon layer are transformed into a second oxide layer and a third oxide layer, respectively, in the first trench; forming a gate structure on the substrate adjacent to the first trench; and forming a plurality of memory cells on the substrate adjacent to the second trench.

In some embodiments the gate structure extends in a direction and has a substantially uniform width along the direction.

In some embodiments the method further comprises, after the step of forming the second oxide layer and the third oxide layer, the step of: planarizing the first oxide layer, the second oxide layer, the third oxide layer and the hard mask until a surface of the substrate is exposed to form a first oxide pattern, a second oxide pattern and a third oxide pattern in the first trench and to form the first oxide pattern in the second trench.

In some embodiments the method further comprises, after the step of forming the SOD layer, the step of: planarizing the SOD layer until a top surface of the polysilicon layer is exposed to form a SOD pattern in the first trench.

In some embodiments a third trench having a third trench width smaller than the first trench width and greater than the second trench width is formed between the second active patterns, the third trench and the second trench being in communication with each other, and the method also comprises a step of forming the first oxide layer to fill the third trench.

In another aspect, embodiments of this invention include a semiconductor device comprising at least an isolation structure formed on a substrate having a plurality of first active patterns in a first region of the substrate and a plurality of second active patterns in a second region of the substrate, and further comprising: a first trench having a first trench width between the first active patterns; a second trench having a second trench width that is smaller than the first trench width between the second active patterns along a first direction; a first isolation structure consisting essentially of a first oxide pattern, a second oxide pattern on the first oxide pattern, and a third oxide pattern on the second oxide pattern, without any silicon nitride liner, fills the first trench; and, an additional isolation structure that includes at least the first oxide pattern fills the second trench.

In some embodiments the semiconductor device further comprises a first oxide pattern comprising a silicon oxide layer formed by a CVD process, an ALD process or a thermal oxidation process; a second oxide pattern comprising a silicon oxide layer formed by oxidizing polysilicon; and a third oxide pattern comprising silicon oxide formed by annealing a spin-on-dielectric (SOD) layer comprising polysilazane.

In some embodiments the semiconductor device further comprises a third trench having a third trench width between the second active patterns along a second direction, wherein the third trench width is less than the first trench width but greater than the second trench width, and also wherein an additional isolation structure fills the third trench.

In some embodiments the semiconductor device includes an additional isolation structure that fills the third trench and comprises at least the first oxide pattern and the second oxide pattern on the first oxide pattern.

In some embodiments the semiconductor device further comprises a gate structure on the substrate adjacent to the first trench and a plurality of memory cells on the substrate adjacent to the second trench.

BRIEF DESCRIPTION OF THE DRAWINGS

Exemplary embodiments will be more clearly understood from the following detailed description taken in conjunction with the accompanying drawings. FIGS. 1A to 29 represent non-limiting, exemplary embodiments as described herein.

FIGS. 1A and 1B are plan views schematically illustrating a semiconductor device including an isolation structure in accordance with exemplary embodiments, and FIG. 2 is a cross-sectional view illustrating the semiconductor device;

FIGS. 3 to 10 are cross-sectional views schematically illustrating stages of forming the semiconductor device including the isolation structure in accordance with some exemplary embodiments;

FIG. 12 is a cross-sectional view illustrating the semiconductor device;

FIGS. 13 to 16 are cross-sectional views schematically illustrating stages of forming the semiconductor device including the isolation structure in accordance with some exemplary embodiments;

FIGS. 17 to 21 are cross-sectional views schematically illustrating stages of forming a semiconductor device including an isolation structure in accordance with some exemplary embodiments;

FIGS. 22 to 26 are cross-sectional views schematically illustrating stages of fouling a semiconductor device including an isolation structure in accordance with some exemplary embodiments;

FIGS. 27 to 30 are cross-sectional views schematically illustrating stages of forming a semiconductor device including an isolation structure in accordance with some exemplary embodiments.

DESCRIPTION OF EMBODIMENTS

Figure 1A:
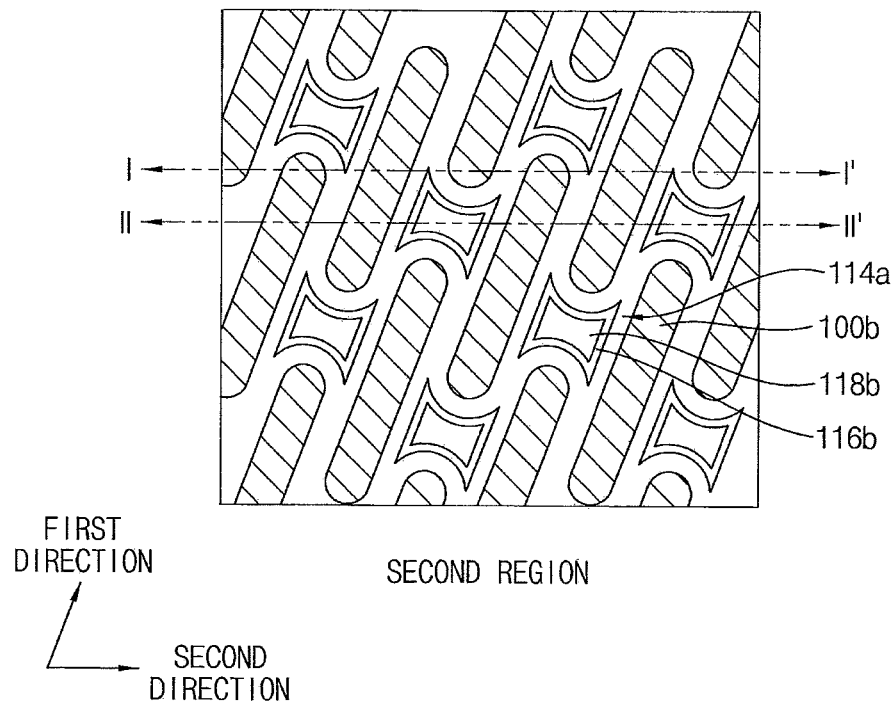

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, for example, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then instead be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations in the shapes of the illustrations as a result, for example, of manufacturing techniques and/or tolerances, are to be expected. Thus, exemplary embodiments should not be construed as limited to the particular shapes of regions illustrated herein but are to include variations in shapes that result, for example, from manufacturing. The regions illustrated in the figures are schematic in nature and their shapes are not necessarily intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
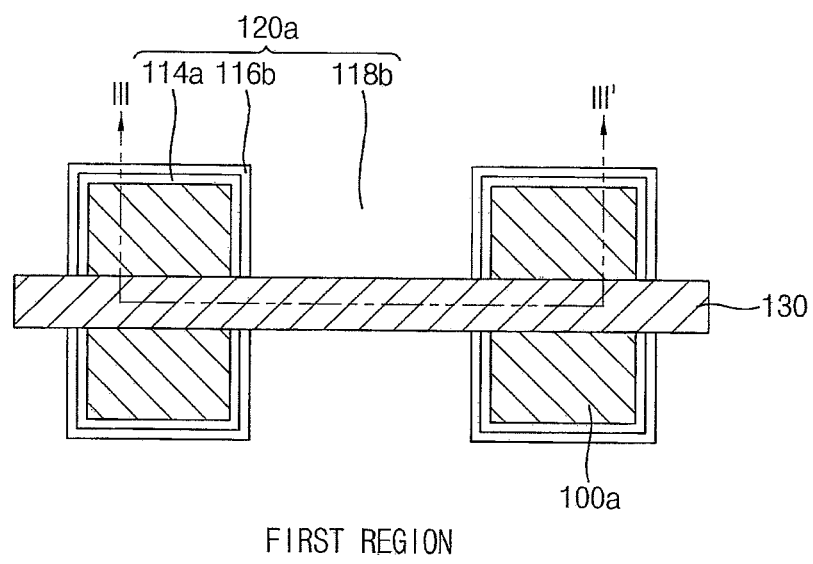
Figure 2:
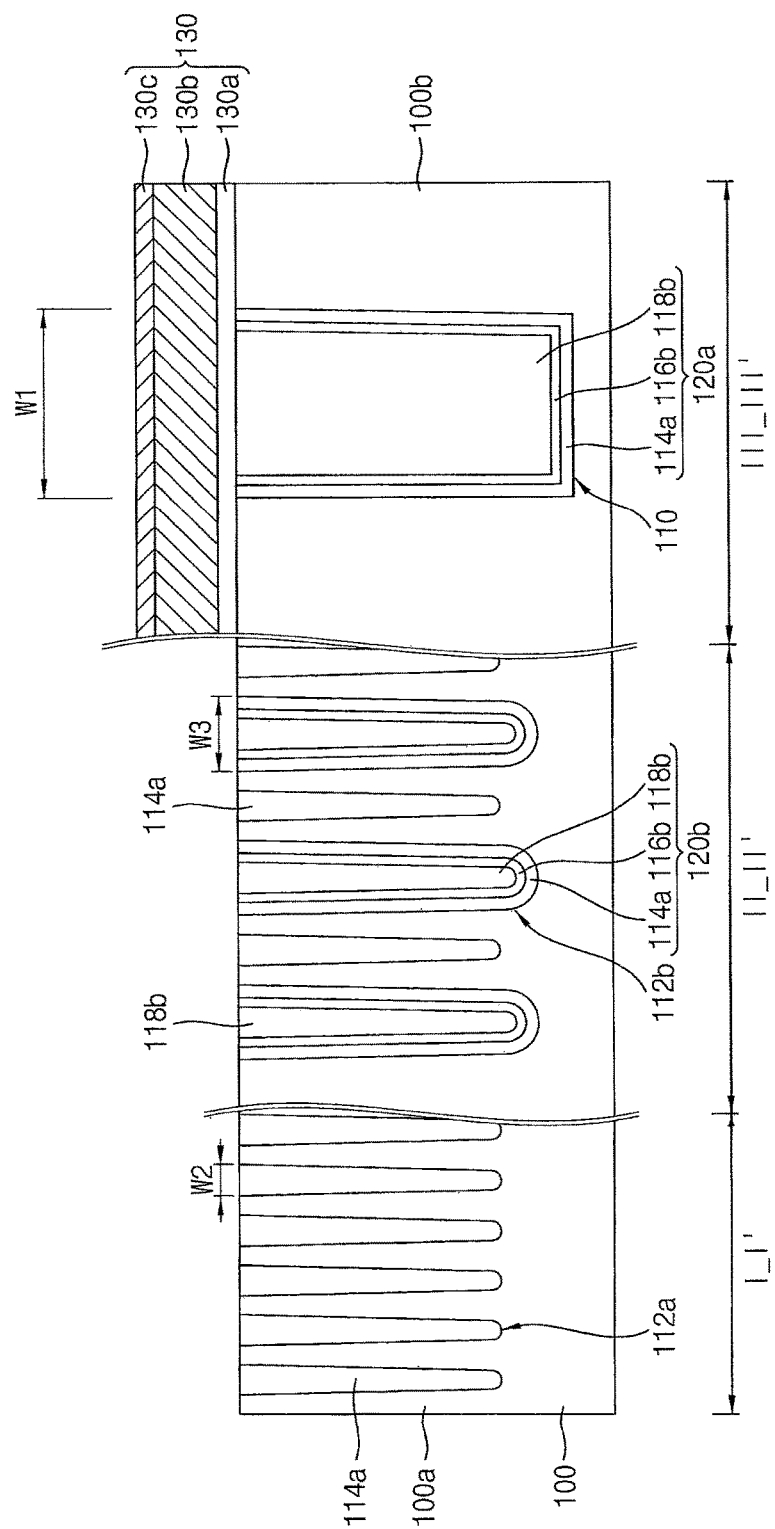

FIGS. 1A and 1B are plan views illustrating a semiconductor device including an isolation structure in accordance with exemplary embodiments, and FIG. 2 is a cross-sectional view illustrating the semiconductor device of FIGS. 1A and 1B.

FIG. 1A is a plan view illustrating a second region of a substrate, and FIG. 1B is a plan view illustrating a first region of the substrate. FIG. 2 shows cross-sections taken along lines I-I', II-II' and III-III', respectively, in FIGS. 1A and 1B. Hereinafter, the terms first and second directions, as shown on FIG. 1A, are directions that are substantially parallel to a top surface of the substrate, and the first and second directions have an acute angle relative to each other.

Referring to FIGS. 1A, 1B and 2, the semiconductor device may include a substrate 100 including the first and second regions.

The substrate 100 may include a semiconductor material, e.g., silicon, germanium, silicon-germanium, etc., or a 3-5 group compound semiconductor, e.g., GaP, GaAs, GaSb, etc. In some embodiments, the substrate 100 may be a silicon-on-insulator (SOI) substrate, a germanium-on-insulator (GOI) substrate, etc.

The second region may serve as a cell region for forming memory cells, and the first region may serve as a peripheral region including peripheral circuits for operating the memory cells.

A plurality of second active patterns 100b may be formed in the second region of the substrate 100, and the memory cells may be formed on the second active patterns 100b. In exemplary embodiments, as illustrated in FIG. 1A, the second active patterns 100b may serve as an active region for forming the memory cells of a DRAM device. A plurality of first active patterns 100a may be formed in the first region of the substrate 100, and the peripheral circuits may be formed on the first active patterns 100a. The first and second active patterns 100a and 100b may be formed by partially etching an upper portion of the substrate 100. A first trench 110 may be formed between the first active patterns 100a, and second and third trenches 112a and 112b may be formed between the second active patterns 100b.

A top area of each of the first active patterns 100a may be greater than a top area of each of the second active patterns 100b. The first trench 110 between the first active patterns 100a may have a first trench width W1.

Each of the second active patterns 100b may extend in a first direction as shown in FIG. 1A. The second active patterns 100b may be arranged in the first direction to be spaced apart from each other. The second active patterns 100b arranged in the first direction may form a second active pattern column. A plurality of second active pattern columns may be arranged along a second direction, as shown in FIG. 1A, to be spaced apart from each other. Thus, the second active patterns 100b as arranged in the first and second directions may fart an active pattern array. The second active patterns 100b may be disposed in a zigzag pattern that extends in the second direction as shown in FIG. 1A.

The second trench 112a may have a second trench width W2 as measured along the second direction, and the third trench 112b may have a third trench width W3 greater than the second trench width W2 as measured along the second direction.

In exemplary embodiments, the second trench 112a may be formed between the second active patterns 100b in the second active pattern columns that are adjacent to each other in the second direction. The third trench 112b may be formed between the second active patterns 100b that are adjacent to each other in the first direction. The second and third trenches 112a and 112b, respectively, may be in communication with each other. Each of the second and third trench widths W2 and W3, respectively, may be less than the first trench width W1. That is, the first trench 110 may have a trench width greater than a trench width of either of the second and third trenches 112a and 112b, respectively.

A first isolation structure 120a may be formed in the first trench 110, and the first isolation structure 120a may include a first oxide pattern 114a, a second oxide pattern 116b and a third oxide pattern 118b sequentially stacked.

The first oxide pattern 114a may be conformally formed on an inner wall of the first trench 110. The first oxide pattern 114a may include, e.g., silicon oxide. The first oxide pattern 114a may be formed by a thermal oxidation process, a chemical vapor deposition (CVD) process or an atomic layer deposition (ALD) process. The second oxide pattern 116b may be conformally formed on the first oxide pattern 114a. The second oxide pattern 116b may include silicon oxide formed by oxidizing polysilicon. The third oxide pattern 118b may be fondled on the second oxide pattern 116b, and may fill a remaining portion of the first trench 110. The third oxide pattern 118b may include silicon oxide formed by coating polysilazane based solution. The first, second and third oxide patterns 114a, 116b, and 118b, respectively, may include silicon oxide formed by different chemical processes.

The first trench 110 is not filled with silicon nitride (as in some other fabrication processes), but instead is filled with silicon oxide. That is, no silicon nitride liner is formed on the inner wall of the first trench 110. When a silicon nitride liner is formed, the silicon nitride liner may trap charges. Then, when a MOS transistor is formed on the first active pattern 100a, the charges trapped by the silicon nitride liner may cause hot electron induced punchthrough (HEIP) to occur during an operation of the MOS transistor. More particularly, holes serving as a majority carrier of a PMOS transistor may be trapped by a silicon nitride liner, so that an effective channel width for a PMOS transistor fabricated with a silicon nitride liner on the first active pattern 100a may decrease. Thus, a threshold voltage of such a PMOS transistor may be lowered, and off-leakage currents of the PMOS transistor may increase.

However, in exemplary embodiments, no silicon nitride liner is formed in the first trench 110, so the incidence of HEIP may decrease.

The second trench 112a may have a trench width W2 that is less than a trench width of either of the first and third trenches 110 and 112b, respectively. The first oxide pattern 114a may fill the second trench 112a. That is, the second and third oxide patterns 116b and 118b, respectively, may not be formed in the second trench 112a.

The third trench 112b may have a trench width W3 that is less than a trench width W1 of the first trench 110 but greater than a trench width W2 of the second trench 112a. A second isolation structure 120b may fill the third trench 112b. The second isolation structure 120b may include the first oxide pattern 114a, the second oxide pattern 116b and the third oxide pattern 118b sequentially stacked. That is, the second isolation structure 120b may include materials substantially the same as, and stacked in the same order as, the materials comprising the first isolation structure 120a.

A MOS transistor may be formed on the first active pattern 100a.

Particularly, as shown in FIG. 1B, a first gate structure 130 may be formed on the first active patterns 100a and the first isolation pattern 120a. The first gate structure 130 may extend in a direction and cross over the first active pattern 100a. In exemplary embodiments, the first gate structure 130 may include a gate insulation layer 130a, a gate electrode 130b and a hard mask 130c sequentially stacked (as shown in FIG. 2). Impurity regions (not shown) may be formed at portions of the first active patterns 100a adjacent to the first gate structure 130, and the impurity regions may serve as source/drain regions of the MOS transistor.

The first gate structure 130 may have a uniform width along the direction in which the first gate structure 130 extends. In exemplary embodiments, a portion of the first gate structure 130 on the first active pattern 100a and a portion of the first gate structure 130 on the first isolation structure 120a may have substantially the same width. That is, the first gate structure 130 may be formed without including a tab portion having an enlarged width for increasing the effective channel length. Even though no tab portion is formed, HER may decrease because no silicon nitride liner is formed in the first trench 110. Also, top areas of the impurity regions adjacent to the first gate structure 130 may increase. Thus, an alignment margin between the impurity region and a wiring structure contacting the impurity region may increase.

Memory cells may be formed on the second active pattern 100b. The memory cells may be DRAM device memory cells. In exemplary embodiments, the DRAM device memory cells may include a selective transistor, a bit line, a contact plug and a capacitor.

In exemplary embodiments the selective transistor may include a buried gate structure (not shown) and impurity regions (not shown). The buried gate structure may be formed through upper portions of the second active pattern 100b, the first oxide pattern 114a and the second isolation structure 120b, and may extend in the second direction. The impurity regions may be formed at portions of the second active pattern 100b adjacent to the buried gate structure. The buried gate structure may serve as a word line.

As described above, the semiconductor device may include isolation structures having good isolation characteristics. Thus, the semiconductor device may have a high reliability.

FIGS. 3 to 10 are cross-sectional views illustrating stages of a method of manufacturing a semiconductor device as shown in FIGS. 1A, 1B and 2, including an isolation structure in accordance with some exemplary embodiments.

Figure 3:
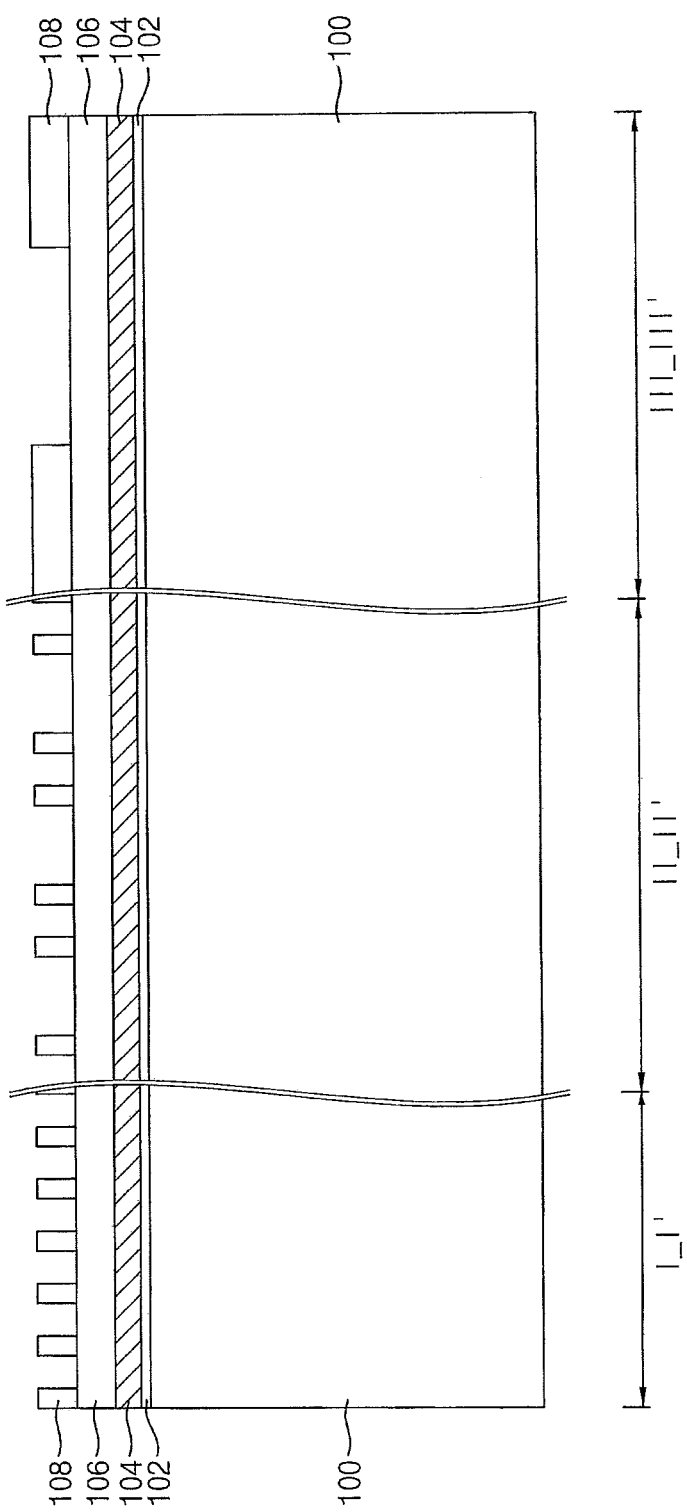

Referring to FIG. 3, a pad insulation layer 102, a stop layer 104, a hard mask layer 106 and a mask pattern 108 may be sequentially formed on a substrate 100 that includes a first region and a second region, as described previously.

The pad insulation layer 102 may be formed by an ALD process, a thermal oxidation process or a CVD process, and may be formed of an oxide, e.g., silicon oxide.

The stop layer 104 may be formed by an ALD process or a CVD process, and may be formed of a nitride, e.g., silicon nitride. The stop layer 104 may serve as a polish stop layer or an etch stop layer in a subsequent planarization process of a silicon oxide layer.

The hard mask layer 106 may be formed by an ALD process or a CVD process, and may be formed of an oxide, e.g., silicon oxide. The hard mask layer 106 may serve as an etching mask for the substrate 100.

The mask pattern 108 may include a photoresist pattern formed by a photo process. Alternatively, the mask pattern 108 may be formed by a dual patterning technology (DPT) process or a quadruple patterning technology (QPT) process.

Figure 4:
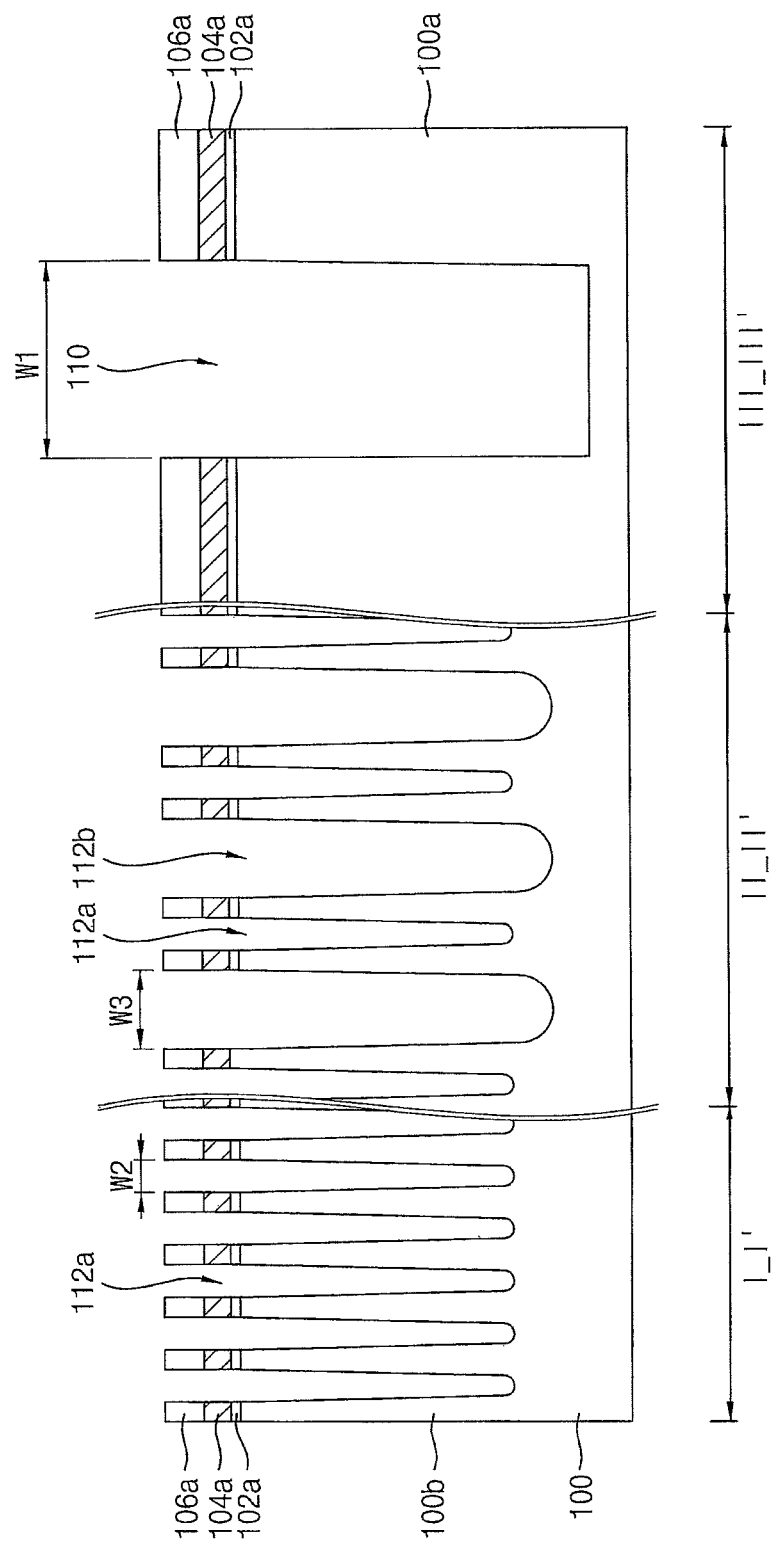

Referring to FIG. 4, the hard mask layer 106, the stop layer 104 and the pad insulation layer 102 may be sequentially etched using the mask pattern 108 as an etching mask to form a pad insulation pattern 102a, a stop pattern 104a and a hard mask 106a sequentially stacked. The substrate 100 may be etched using the hard mask 106a as an etching mask to form first active patterns 100a in the first region and second active patterns 100b in the second region. Also, a first trench 110 may be formed between the first active patterns 100a, and a second trench 112a and a third trench 112b may be formed between the second active patterns 100b. The etching process may include an anisotropic etching process.

As described above, the first active patterns 100a may be formed in the first region of the substrate 100, and the second active patterns 100b may be formed in the second region of the substrate 100.

As shown in FIGS. 1A and 1B, a top area of each of the first active patterns 100a may be greater than a top area of each of the second active patterns 100b. The first trench 110 between the first active patterns 100a may have a first width W1.

Each of the second active patterns 100b may extend in the first direction. The second active patterns 100b may be arranged in the first direction to be spaced apart from each other. The second active patterns 100b arranged in the first direction may form a second active pattern column. A plurality of second active pattern columns may be arranged in the second direction to be spaced apart from each other. The second active patterns 100b may be formed in a zigzag pattern in the second direction. These structural configurations are shown in FIGS. 1A, 1B and 2, as previously described.

The second trench 112*a* may be formed between ones of the second active patterns 100*b* in the second active pattern columns that are adjacent to each other in the second direction. The second trench 112*a* may have a second width W2 in the second direction. The third trench 112*b* may be formed between the second active patterns 100*b* that are adjacent to each other in the first direction. The third trench 112*b* may have a third width W3 in the second direction that is greater than the second width W2 in the second direction. The second and third trenches 112*a* and 112*b*, respectively, may be in communication with each other. Each of the second and third widths W2 and W3 may be less than the first width W1.

Figure 5:
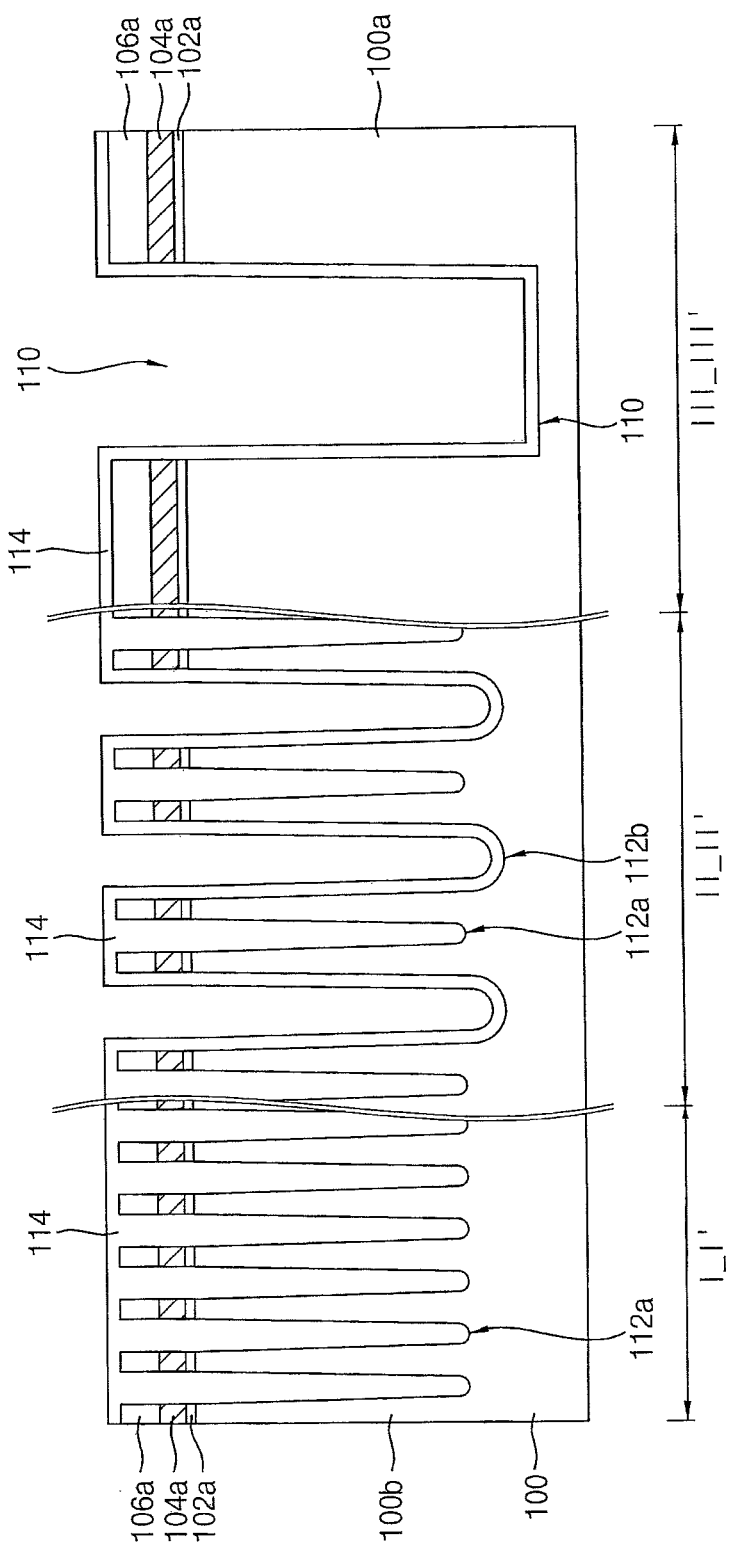

Referring to FIG. 5, a first oxide layer 114 may be formed on inner walls of the first, second and third trenches 110, 112*a* and 112*b*, respectively, and a top surface of the hard mask 106*a*.

The first oxide layer 114 may be formed to sufficiently fill the second trench 112*a*. The first oxide layer 114 may be conformally formed on the inner walls of the first and third trenches 110 and 112*b*, respectively. Thus, the first oxide layer 114 may be formed to only partially fill the first and third trenches 110 and 112*b*.

The first oxide layer 114 may be formed by an ALD process, a thermal oxidation process or a CVD process, and may be formed of an oxide, e.g., silicon oxide.

Figure 6:
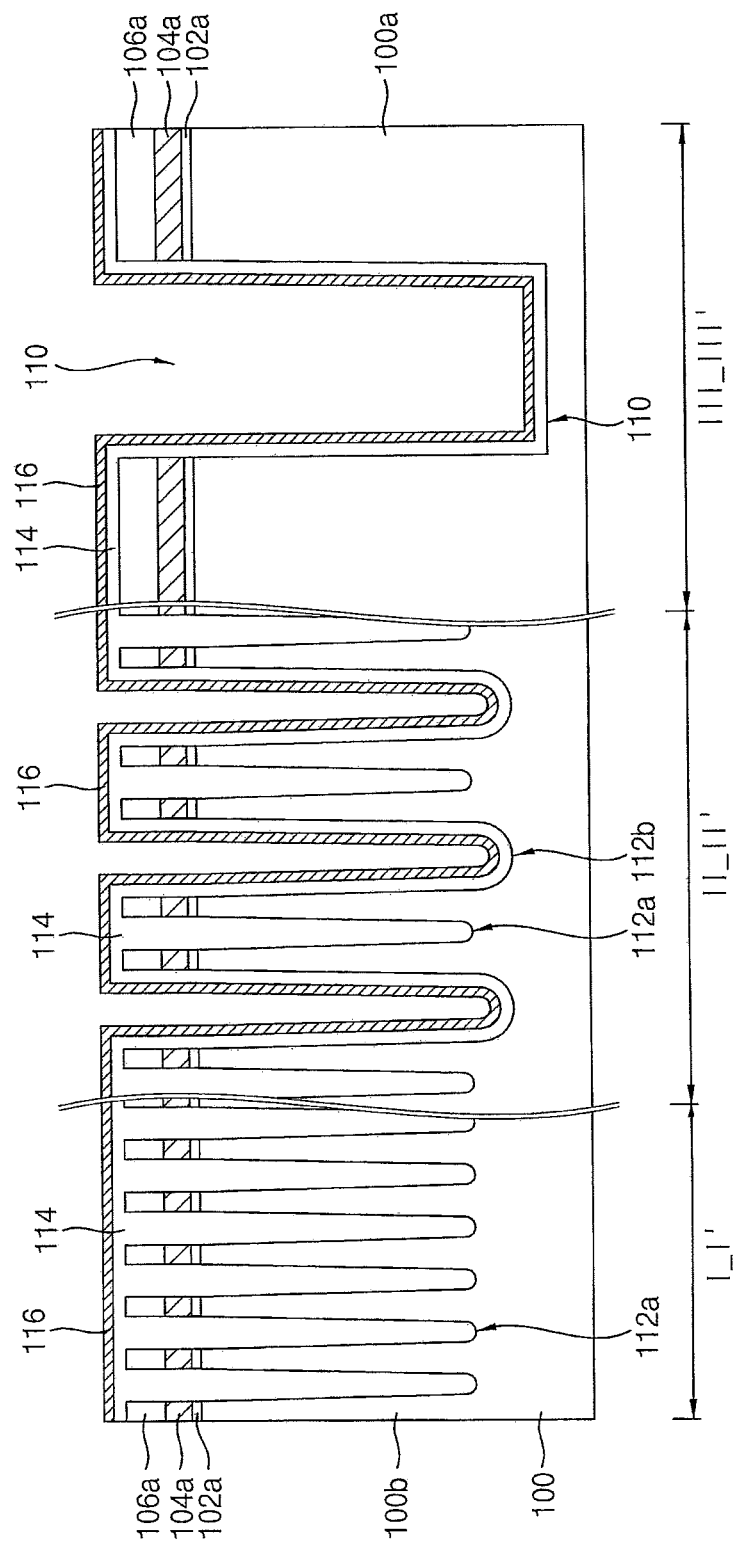

Referring to FIG. 6, a polysilicon layer 116 may be formed on the first oxide layer 114.

The polysilicon layer 116 may be conformally formed on the first oxide layer 114 in the first and third trenches 110 and 112*b*, respectively. Thus, the polysilicon layer 116 may be formed to only partially fill the first and third trenches 110 and 112*b*.

The second trench 112*a* may be sufficiently filled by the first oxide layer 114, so that the polysilicon layer 116 may be formed over the second trench 112*a*, as shown in FIG. 6.

The polysilicon layer 116 may be formed by an ALD process or a CVD process. The polysilicon layer 116 may serve as a diffusion barrier layer for preventing the diffusion of oxygen during a subsequent annealing process.

Figure 7:
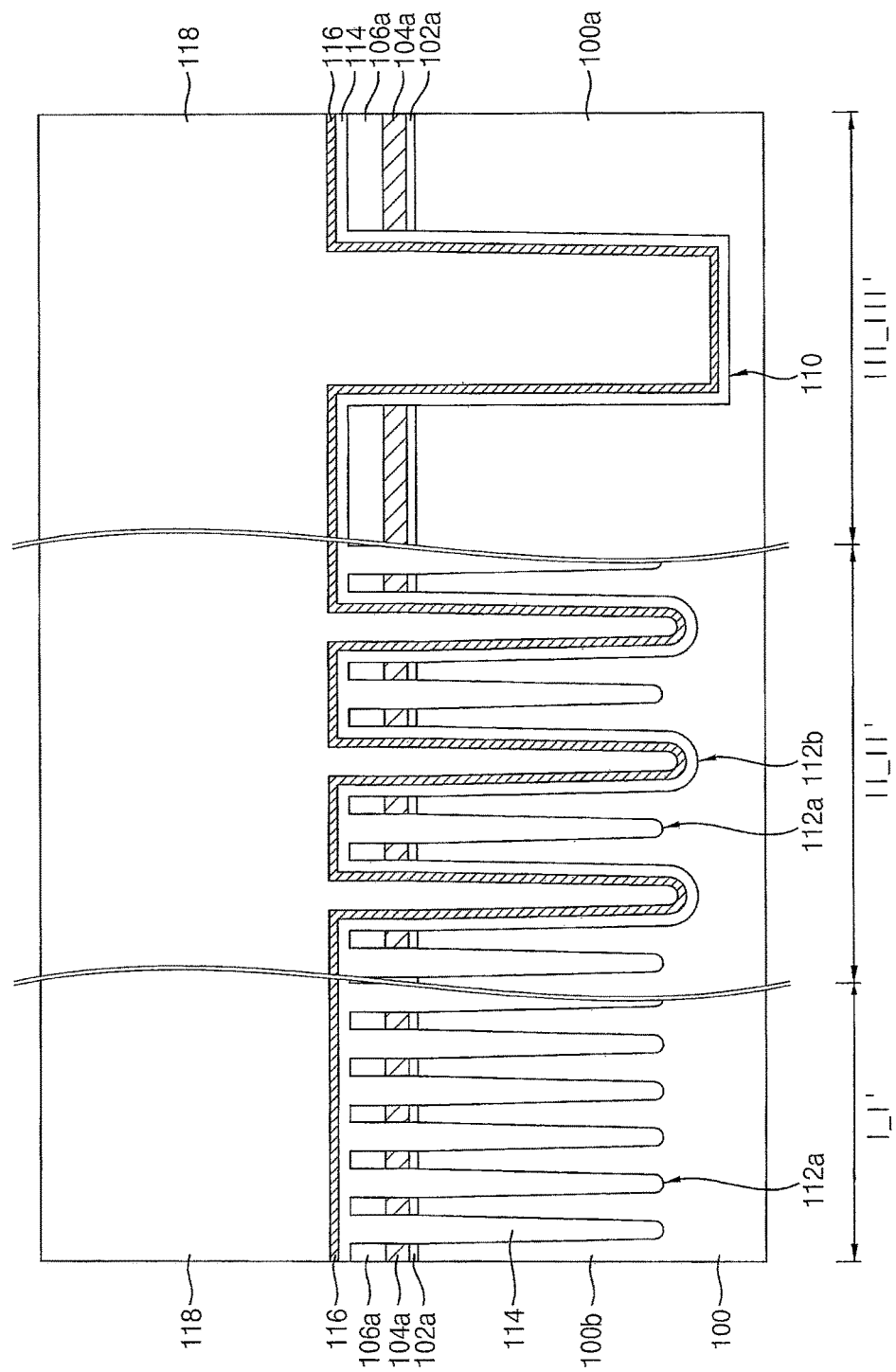

Referring to FIG. 7, a spin-on-dielectric (SOD) layer 118 having good gap filling characteristics may be formed on the polysilicon layer 116. The SOD layer 118 may be formed by a spin coating process using polysilazane based solution. In exemplary embodiments, the SOD layer 118 may include Si—N bonds, Si—H bonds and N—H bonds, etc.

The SOD layer 118 may be formed to sufficiently fill the first and third trenches 110 and 112*b*, respectively.

Figure 8:
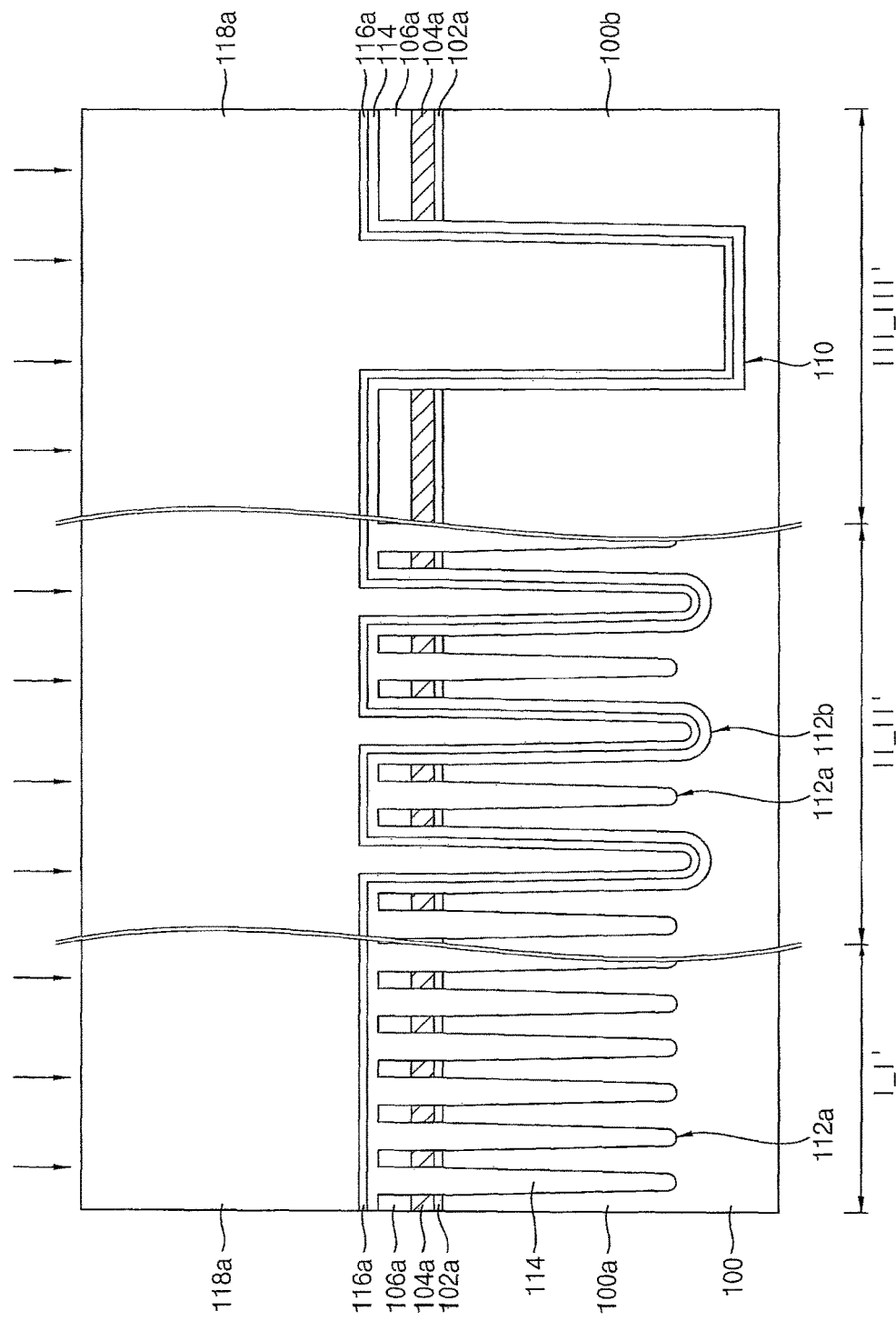

Referring to FIG. 8, an annealing process may be performed on the SOD layer 118 and the polysilicon layer 116. Each of the SOD layer 118 and the polysilicon layer 116 may be transformed into a silicon oxide layer by the annealing process.

The annealing process may be performed under an atmosphere of $H_2O$, or under an atmosphere of hydrogen ($H_2$) and oxygen ($O_2$). The annealing process may be performed at a temperature of about 300° C. to about 1100° C. for a period of about 30 minutes to about 120 minutes.

The Si—N bonds, Si—H bonds and N—H bonds in the SOD layer 118 may be substituted with Si—O bonds by the annealing process, and thus a third oxide layer 118*a* including silicon oxide may be formed on the substrate. Also, the polysilicon layer 116 may be reacted with oxygen so that a second oxide layer 116*a* may be formed. The polysilicon layer 116 may thereby be transformed completely into the second oxide layer 116*a*, and thus none of the original polysilicon layer 116 may remain.

Thus, the polysilicon layer 116 may not remain in the first and third trenches 110 and 112*b*, respectively. Also, each of the first, second and third oxide layers 114, 116*a* and 118*a*, respectively, may include silicon oxide formed by different processes.

As discussed above, the polysilicon layer 116 may serve as a diffusion barrier layer for preventing the diffusion of oxygen into the substrate 100 during the annealing process. That is, the polysilcon layer 116 may be oxidized, so that the diffusion of oxygen into sidewalls of the first and third trenches 110 and 112*b* may be reduced or prevented.

Figure 9:
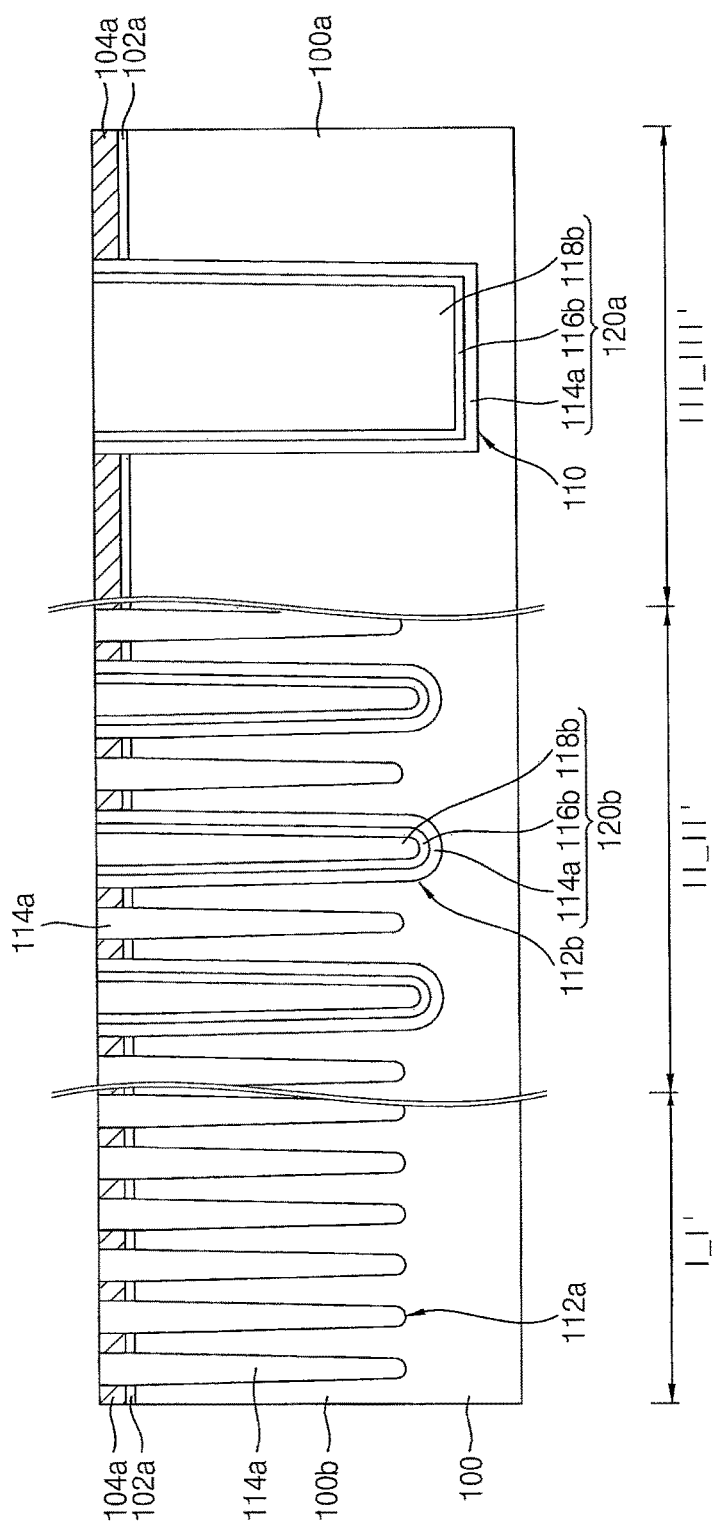

Referring to FIG. 9, the third oxide layer 118*a*, the second oxide layer 116*a*, the first oxide layer 114 and the hard mask 106*a* (as shown in FIG. 8) may be planarized until the stop pattern 104*a* may be exposed. Thus, a first isolation structure 120*a* may be formed in the first trench 110, which may include first, second and third oxide patterns 114*a*, 116*b* and 118*b*, respectively. The first oxide pattern 114*a* may also be formed in the second trench 112*a*. The second isolation structure 120*b* may be formed in the third trench 112*b*, and may include the first, second and third oxide patterns 114*a*, 116*b* and 118*b*, respectively.

The planarization process may be performed by an etch back process and/or a chemical mechanical polishing (CMP) process. In exemplary embodiments, the stop pattern 104*a* may serve as a polish stop layer or an etch stop layer in the planarization process.

In some exemplary embodiments, the planarization process may be performed before the annealing process. That is, the planarization process and the annealing process may be sequentially performed, so that the first, second and third oxide patterns 114*a*, 116*b* and 118*b*, respectively, may be formed regardless of the order in which the planarization and the annealing processes are performed.

Figure 10:
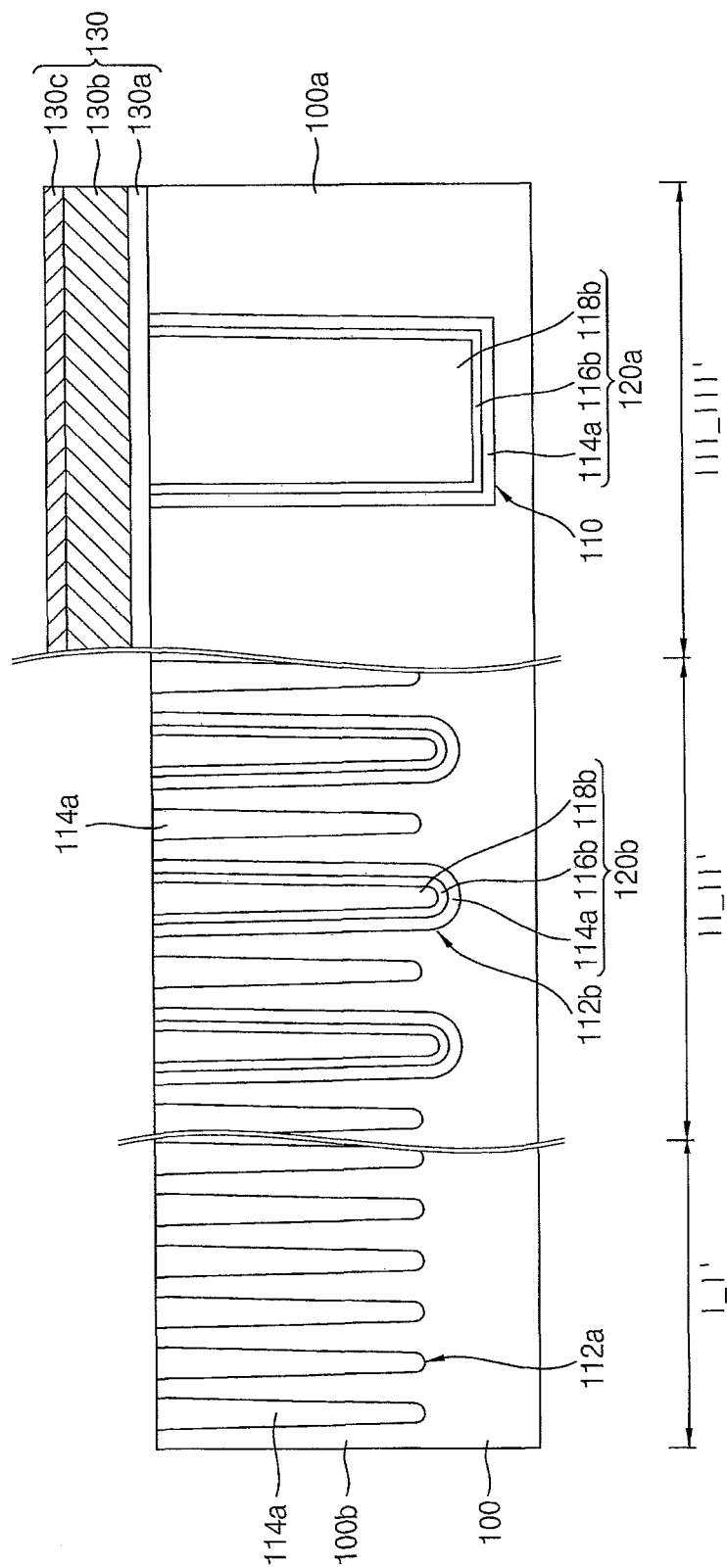

Referring to FIG. 10, the stop pattern 104*a* may be removed by, e.g., an isotropic etching process.

The pad insulation pattern 102*a* may be removed to expose top surfaces of the first and second active patterns 100*a* and 100*b*, respectively. In exemplary embodiments, upper portions of the first, second and third oxide patterns 114*a*, 116*b* and 118*b*, respectively, may be partially etched during the removal of the pad insulation pattern 102*a*.

A first gate structure 130 may be formed on the first active pattern 100*a* and the first isolation structure 120*a* Impurity regions (not shown) may be formed at a portion of the first active pattern 100*a* adjacent to the first gate structure 130, and the impurity regions may serve as source/drain regions. Thus, a MOS transistor may be formed on the first active pattern 100*a*.

The first gate structure 130 may include a gate insulation layer 130*a*, a gate electrode 130*b* and a hard mask 130*c* sequentially stacked on the first active pattern 100*a*. A gate electrode layer and a gate insulation layer may be etched using the hard mask 130*c* as an etching mask to form the first gate structure 130. The first gate structure 130 may extend in a direction to cross over the first active pattern 100*a*. The first gate electrode 130*b* may have a uniform width along the direction in which the first gate structure 130 extends.

Impurities may be doped into portions of the first active patterns adjacent to the first gate structure 130 to form the impurity regions.

The first isolation structure 120*a* may thereby be formed without a silicon nitride liner. Thus, operational failures such as HEIP in the MOS transistor on the first active pattern 100*a* may decrease.

Memory cells may be formed on the second active patterns 100*b*. In exemplary embodiments, a selective transistor, a bit line, contact plugs and a capacitor may be formed on the second active patterns 100b to form the memory cells of a DRAM device.

As described above, the semiconductor device may include isolation structures having good isolation characteristics. Thus, the semiconductor device may have a high reliability.

Figure 11A:
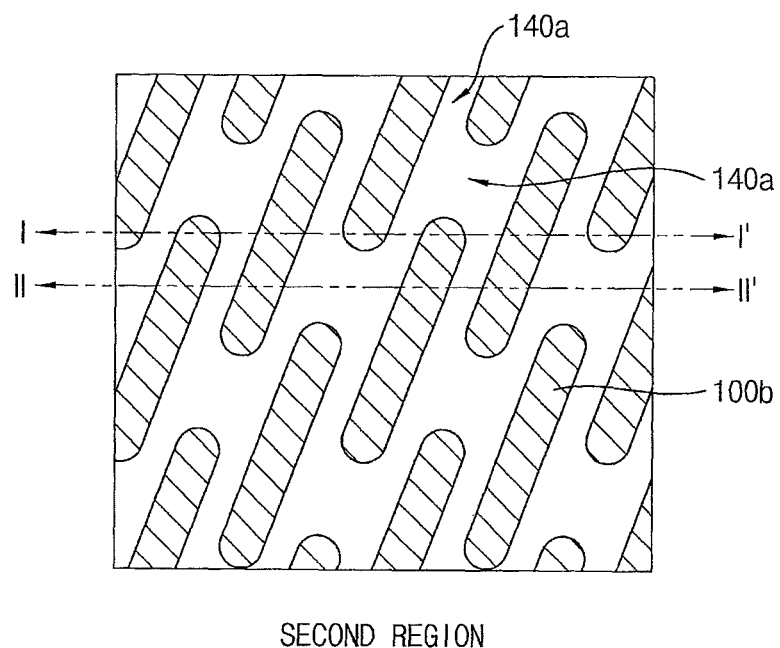
FIGS. 11A and 11B are plan views schematically illustrating a semiconductor device including an isolation structure in accordance with exemplary embodiments.
Figure 11B:
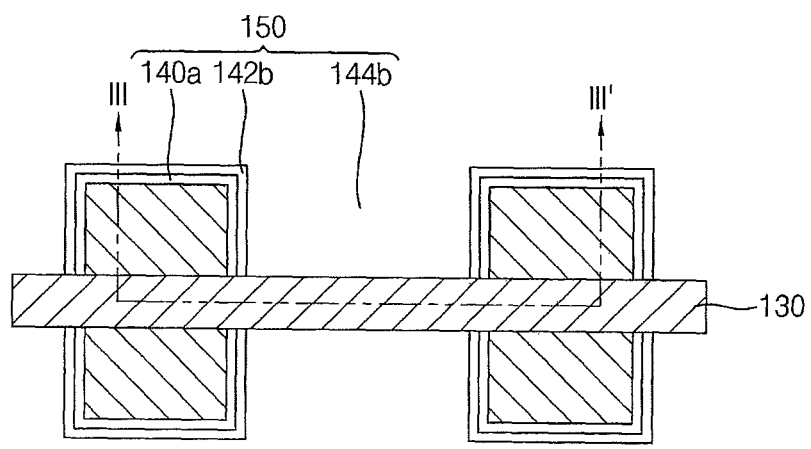
Figure 12:
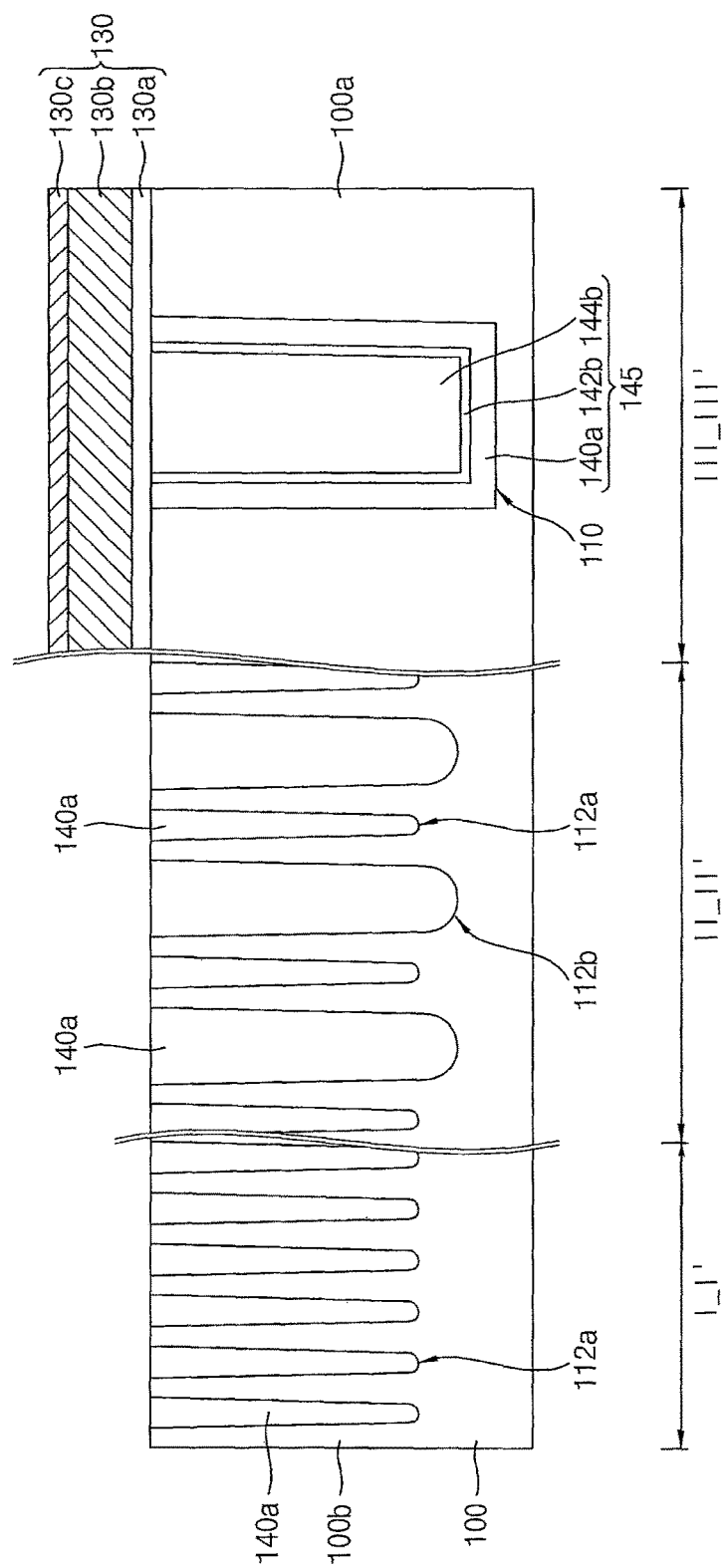

FIGS. 11A and 11B are plan views illustrating a semiconductor device including an isolation structure in accordance with some exemplary embodiments, and FIG. 12 is a cross-sectional view illustrating the semiconductor device.

FIG. 11A is a plan view illustrating a second region of a substrate, and FIG. 11B is a plan view illustrating a first region of the substrate. FIG. 12 shows cross-sections taken along lines I-I', II-II' and III-III', respectively, in FIGS. 11A and 11B.

The semiconductor device of FIGS. 11A, 11B and 12 may be substantially the same as the semiconductor device of FIGS. 1A, 1B and 2 except for the oxide patterns Ruined in the second and third trenches. Because of these similarities, some of the reference numerals used in FIGS. 1A, 1B and 2 are also used in identifying comparable features of the semiconductor device of FIGS. 11A, 11B and 12.

Referring to FIGS. 11A, 11B and 12, the semiconductor device may include a substrate 100 including a first region and a second region.

A plurality of second active patterns 100b may be formed in the second region of the substrate 100, and memory cells may be formed on the second active patterns 100b. A plurality of first active patterns 100a may be formed in the first region of the substrate 100, and peripheral circuits may be formed on the first active patterns 100a. A first trench 110 may be formed between the first active patterns 100a, and second and third trenches 112a and 112b, respectively, may be formed between the second active patterns 100b.

The first and second active patterns 100a and 100b and the first, second and third trenches 110, 112a and 112b, respectively, may be substantially the same as or similar to the first and second active patterns 100a and 100b and the first, second and third trenches 110, 112a and 112b illustrated with reference to FIGS. 1A, 1B and 2, respectively.

The first trench 110 may have a first width W1 that is greater than a width of either of the second and third trenches 112a and 112b. An isolation structure 145 including a first oxide pattern 140a, a second oxide pattern 142b and a third oxide pattern 144b sequentially stacked may be formed in the first trench 110. Each of the first, second and third oxide patterns 140a, 142b and 144b, respectively, may include silicon oxide formed by different processes. The first, second and third oxide patterns 140a, 142b and 144b may include materials substantially the same as or similar to the materials of the first, second and third oxide patterns 114a, 116b and 118b illustrated with reference to FIGS. 1A, 1B and 2, respectively. The first oxide pattern 140a in FIG. 12 may have a thickness greater than a thickness of the first oxide pattern 114a illustrated with reference to FIG. 2.

The first oxide pattern 140a may be formed to fill the second and third trenches 112a and 112b, respectively. In this case, the second and third oxide patterns 142b and 144b will not fill the second and third trenches 112a and 112b because these trenches have already been filled with the first oxide pattern 140a.

A MOS transistor may be formed on the first active patterns 100a. The MOS transistor may include a first gate structure 130 and impurity regions (not shown). The MOS transistor may be substantially the same as or similar to the MOS transistor illustrated with reference to FIGS. 1A, 1B and 2. Because no silicon nitride liner is formed on an inner wall of the first trench 110, operational failures such as HELP may decrease.

Memory cells may be formed on the second active patterns 100b. The memory cells may be DRAM device memory cells.

As described above, the semiconductor device may include isolation structures having good isolation characteristics. Thus, the semiconductor device may have a high reliability.

FIGS. 13 to 16 are cross-sectional views illustrating stages of a method of manufacturing a semiconductor device as shown in FIGS. 11A, 11B and 12, including an isolation structure in accordance with some exemplary embodiments. Each of FIGS. 13 to 16 shows cross-sections taken along lines I-I', II-II' and III-III', respectively, in FIGS. 11A and 11B.

Figure 13:
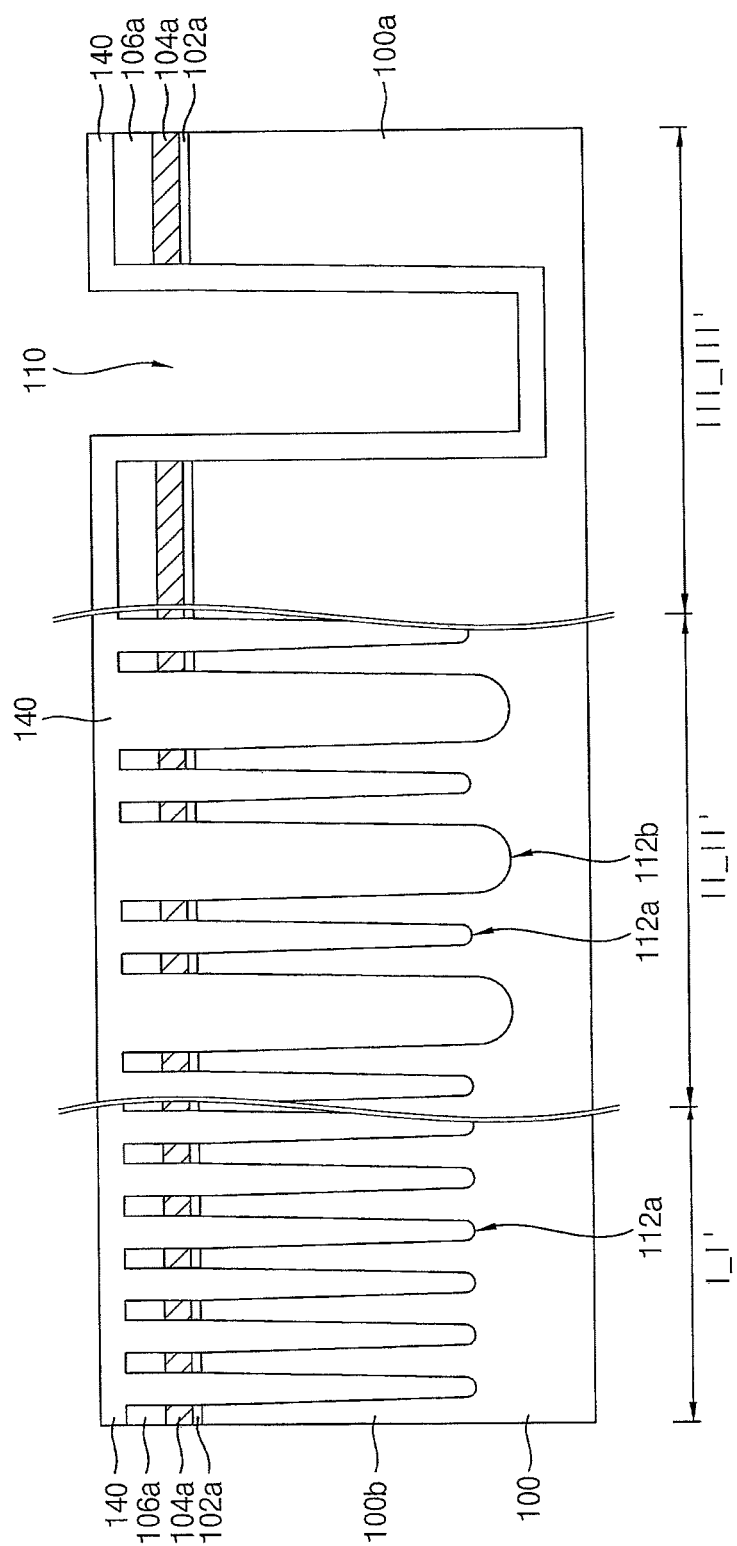

Referring to FIG. 13, processes substantially the same as or similar to the processes illustrated with reference to FIGS. 3 and 4 may be performed. Thus, first and second active patterns 100a and 100b, respectively, may be formed on the first region and the second region, respectively. Also, a first trench 110 may be formed between the first active patterns 100a, and second and third trenches 112a and 112b may be formed between the second active patterns 100b.

A first oxide layer 140 may be formed on inner walls of the first, second and third trenches 110, 112a and 112b, respectively, and also on a top surface of the hard mask 106a.

The first oxide layer 140 may be formed to sufficiently fill the second and third trenches 112a and 112b. The first oxide layer 140 may sufficiently fill the third trench 112b having the third width W3. Thus, in order to sufficiently fill the third trench 112B, the first oxide layer 140 may be formed to have a thickness greater than a thickness of the first oxide layer 114 illustrated with reference to FIG. 5. Also, the first oxide layer 140 may be conformally formed on the inner wall of the first trench 110. Thus, the first oxide layer 140 may be formed to only partially fill the first trench 110.

The first oxide layer 140 may be formed by an ALD process, a thermal oxidation process or a CVD process, and thus may be formed of an oxide, e.g., silicon oxide.

Figure 14:
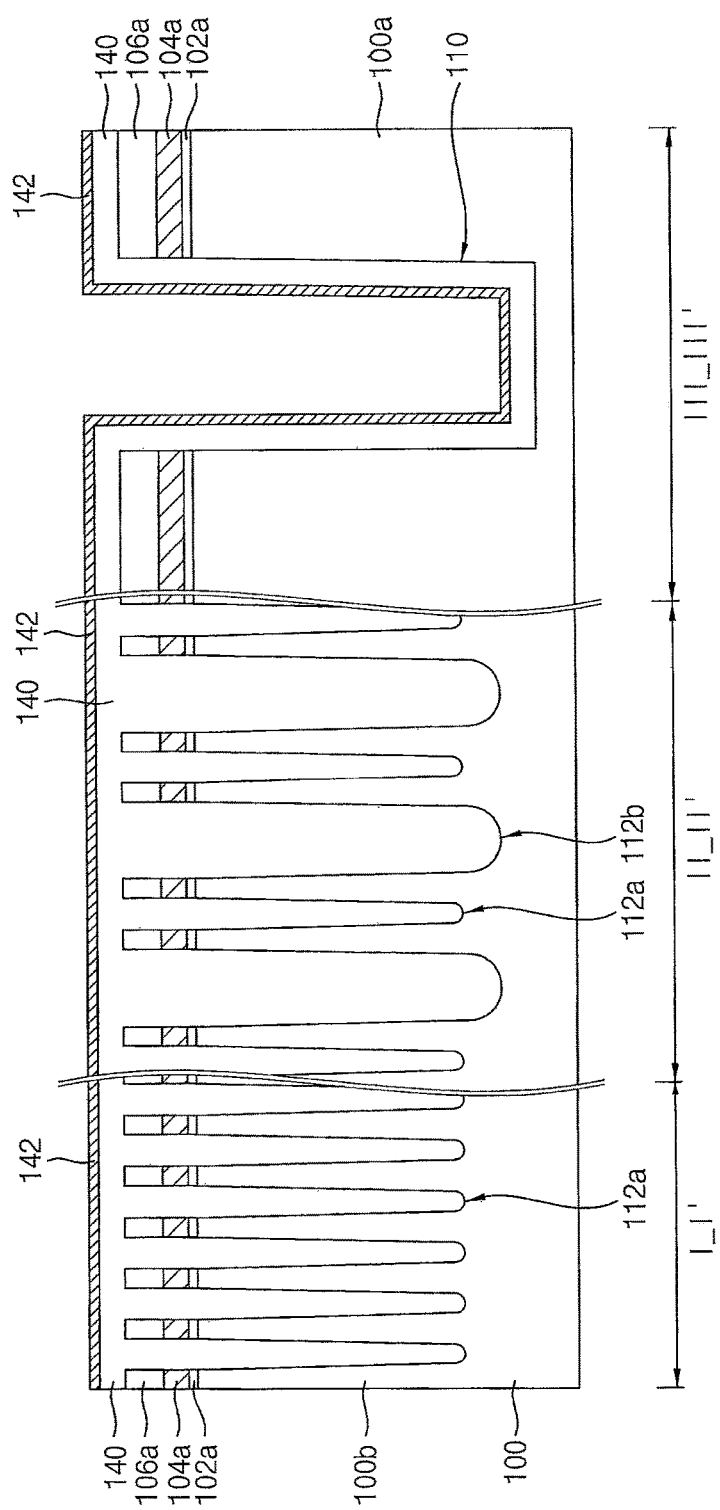

Referring to FIG. 14, a polysilicon layer 142 may be formed on the first oxide layer 140.

The polysilicon layer 142 may be conformally formed on the first oxide layer 140. Thus, the polysilicon layer 142 may be formed to only partially fill the first trench 110.

The second and third trenches 112a and 112b, respectively, may be sufficiently filled with the first oxide layer 140, so that the polysilicon layer 142 may be formed above the second and third trenches 112a and 112b.

Figure 15:
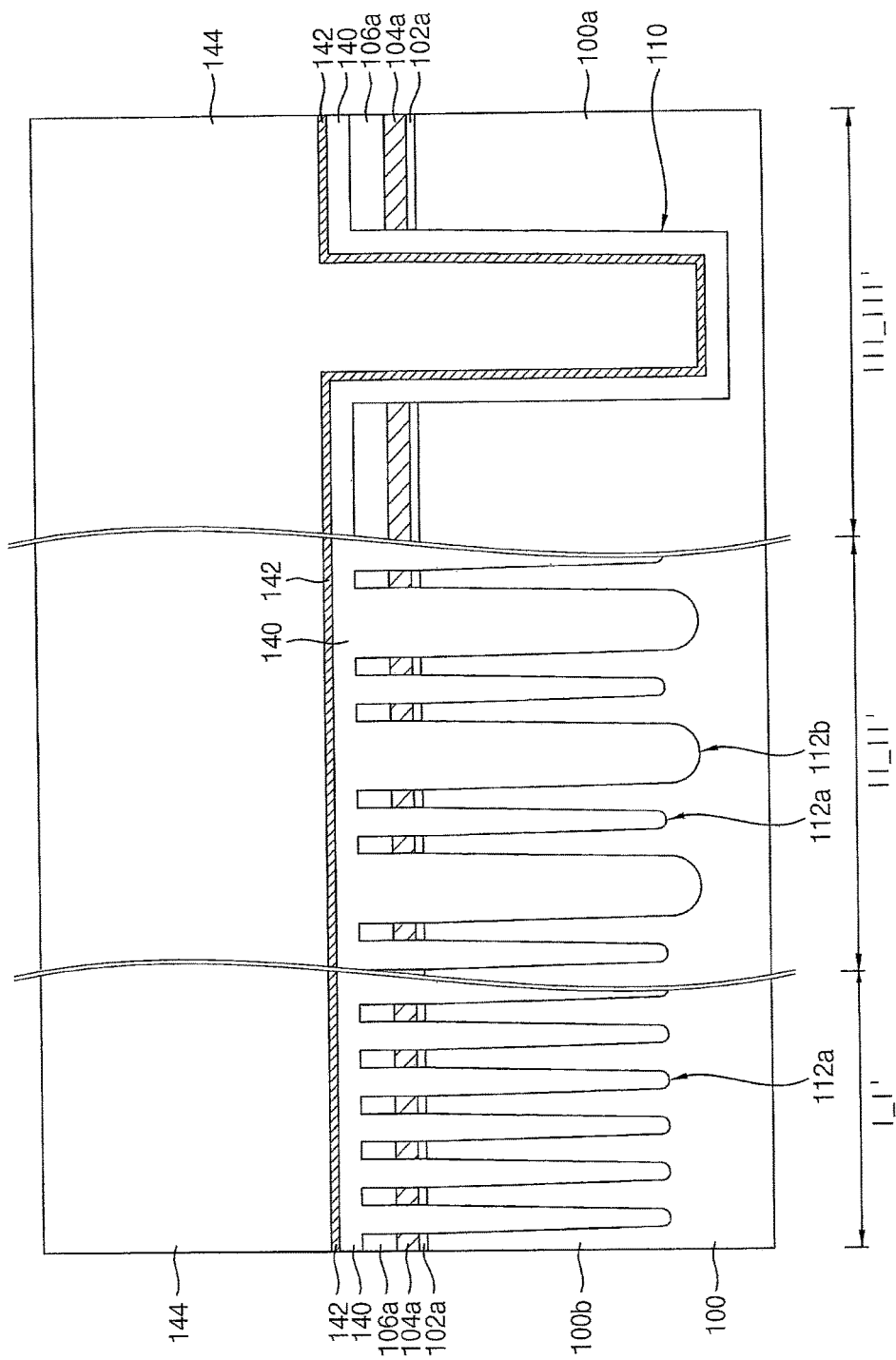

Referring to FIG. 15, a SOD layer 144 having good gap filling characteristics may be formed on the polysilicon layer 142. The SOD layer 144 may be formed by a spin coating process using polysilazane based solution. In exemplary embodiments, the SOD layer 144 may include Si—N bonds, Si—H bonds and N—H bonds, etc. The SOD layer 144 may be formed to sufficiently fill the first trench 110.

Figure 16:
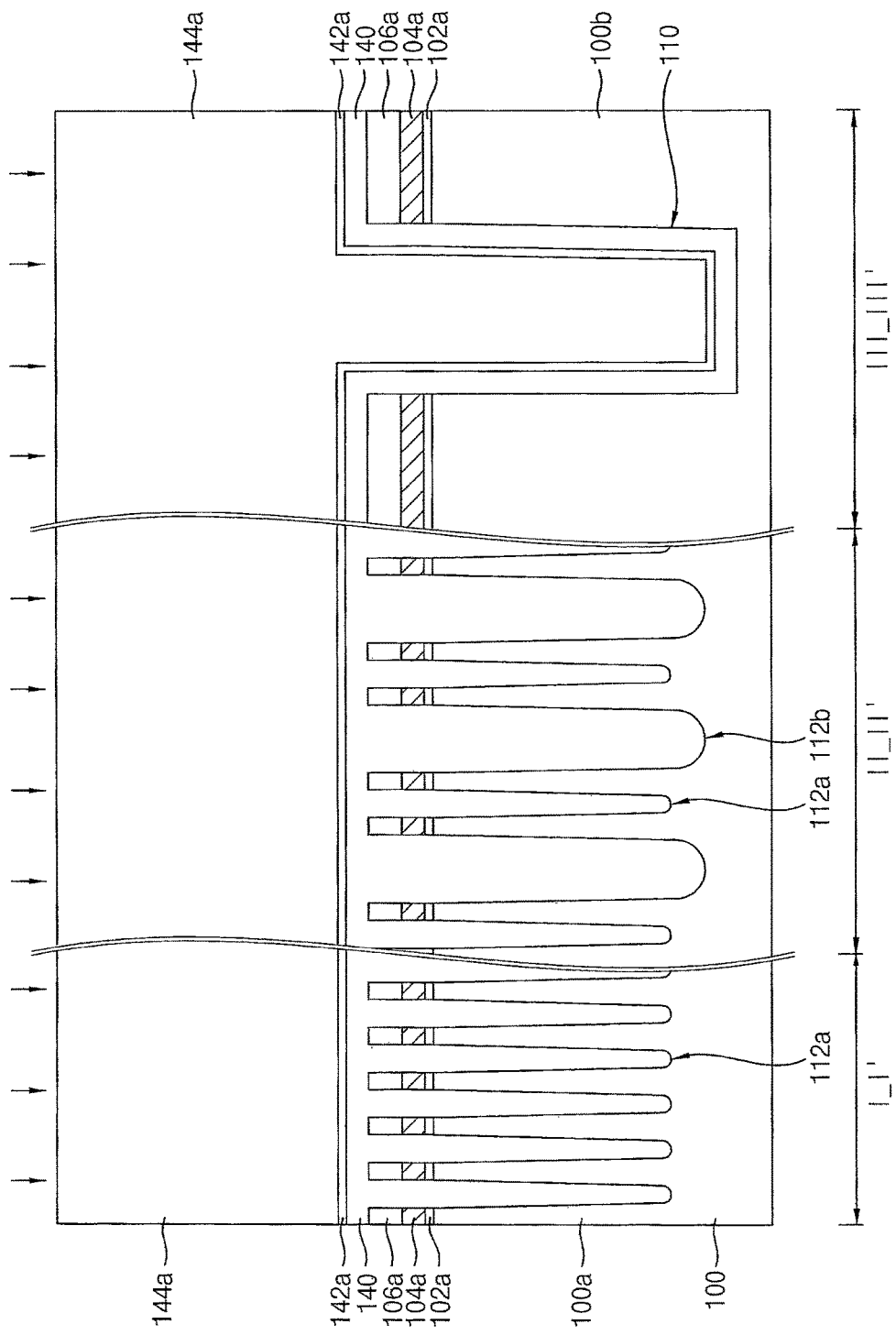

Referring to FIG. 16, an annealing process may be performed on the SOD layer 144 and the polysilicon layer 142. Each of the SOD layer 144 and the polysilicon layer 142 may be transformed into a silicon oxide layer by the annealing process.

The annealing process may be performed under an atmosphere of $H_2O$ or under an atmosphere of hydrogen ($H_2$) and oxygen ($O_2$). The annealing process may be performed at a temperature of about 300° C. to about 1100° C. for a period of about 30 minutes to about 120 minutes.

The Si—N bonds, Si—H bonds and N—H bonds in the SOD layer 144 may be substituted with Si—O bonds by the annealing process, and thus a third oxide layer 144a including silicon oxide may be formed on the substrate. Also, the polysilicon layer 142 may be reacted with oxygen so that a second oxide layer 142a may be formed. The polysilicon layer 142 may thereby be transformed completely into the second oxide layer 142a, and thus none of the original polysilicon layer 142 may remain. Thus, the polysilicon layer 142 may not remain in the first trench 110.

The first, second and third oxide layers 140, 142a and 144a may thereby be formed in the first trench 110. Also, each of the first, second and third oxide layers 140, 142a and 144a, respectively, may include silicon oxide formed by different processes.

As discussed above, the polysilicon layer 142 may serve as a diffusion barrier layer for preventing the diffusion of oxygen into the substrate 100 during the annealing process.

Processes substantially the same as or similar to the processes illustrated with reference to FIGS. 9 to 10 may then be performed to form the semiconductor device of FIGS. 11A, 11B and 12.

That is, the third oxide layer 144a, the second oxide layer 142a, the first oxide layer 140 and the hard mask 106a (as shown in FIG. 16) may be planarized until the stop pattern 104a may be exposed. The stop pattern 104a may then be removed, and the pad insulation pattern 102a may also be removed.

Thus, an isolation structure 145 (as shown in FIG. 12) including the first, second and third oxide patterns 140a, 142b and 144b, respectively, may be formed in the first trench 110. The first oxide pattern 140a may be formed in the second and third trenches 112a and 112b.

A MOS transistor may be formed on the first active pattern 100a to complete the semiconductor device of FIGS. 11A, 11B and 12.

FIGS. 17 to 21 are cross-sectional views illustrating stages of a method of manufacturing a semiconductor device including an isolation structure in accordance with some exemplary embodiments. The semiconductor device of FIGS. 1A, 1B and 2 may be manufactured by processes described below, which differ in certain respects from the processes described above with reference to FIGS. 3-10.

Figure 17:
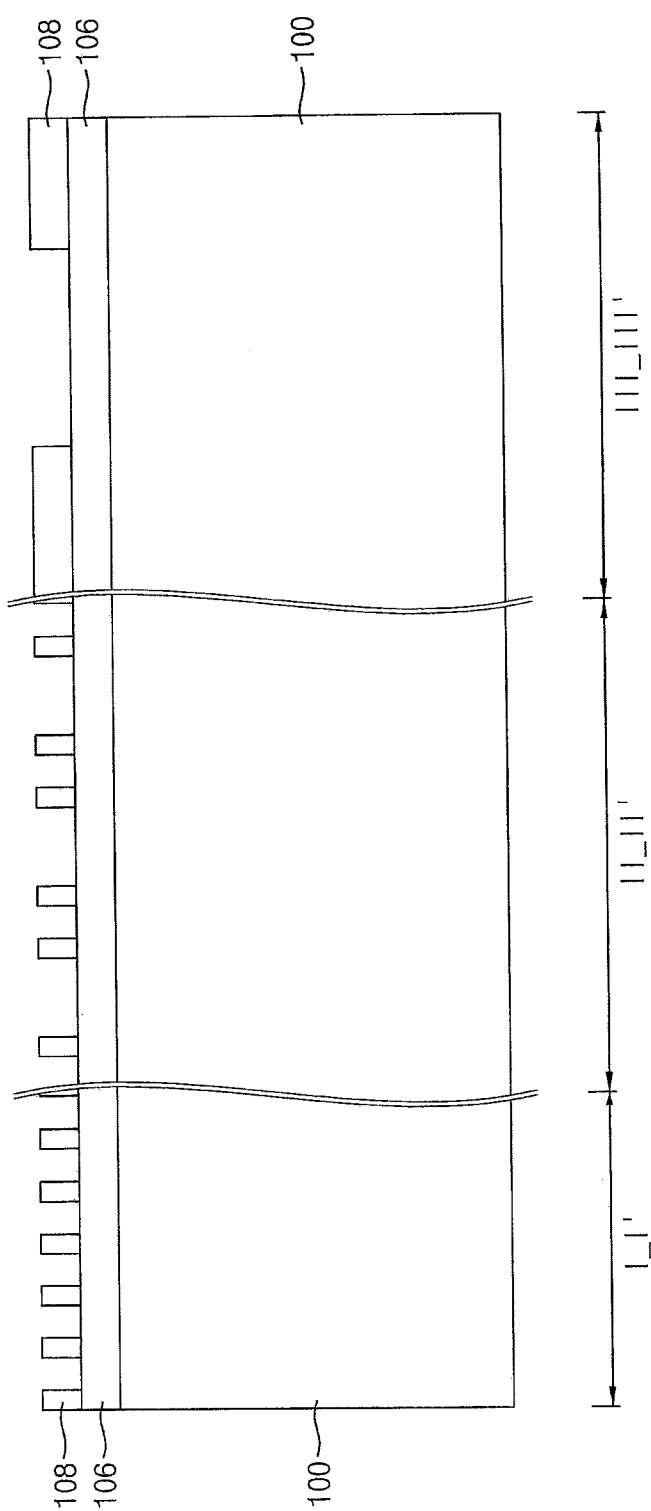

Referring to FIG. 17, a hard mask layer 106 and a mask pattern 108 may be sequentially formed on a substrate 100 that includes a first region and a second region.

The hard mask layer 106 may directly contact the upper surface of the substrate 100. That is, in this embodiment, no pad insulation layer and no stop layer is formed between the hard mask layer 106 and the substrate 100.

The hard mask layer 106 may be formed by an ALD process or a CVD process, and may be formed of an oxide, e.g., silicon oxide. The hard mask layer 106 may serve as an etching mask for the substrate 100.

The mask pattern 108 may include a photoresist pattern formed by a photo process. Alternatively, the mask pattern 108 may be formed by a dual patterning technology (DPT) process or a quadruple patterning technology (QPT) process.

Figure 18:
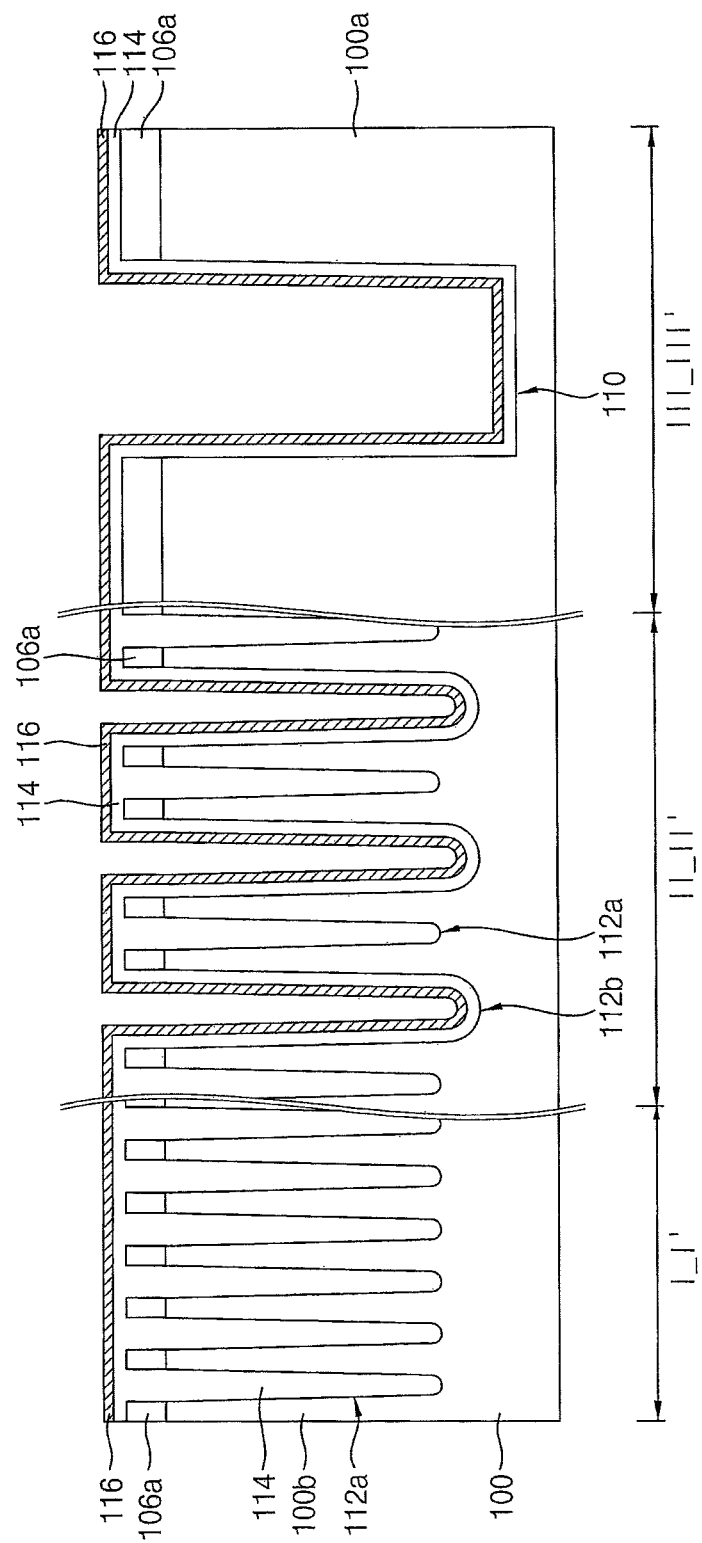

Referring to FIG. 18, the hard mask layer 106 may be etched using the mask pattern 108 as an etching mask to form a hard mask 106a. The substrate 100 may be etched using the hard mask 106a as an etching mask to form first active patterns 100a and second active patterns 100b. Also, a first trench 110 may be formed between the first active patterns 100a, and a second trench and a third trench 112a and 112b, respectively, may be formed between the second active patterns 100b.

A first oxide layer 114 may be formed on inner walls of the first, second and third trenches 110, 112a and 112b, respectively, and also on a top surface of the hard mask 106a. The first oxide layer 114 may be formed to sufficiently fill the second trench 112a, and may be conformally formed on the inner walls of the first and third trenches 110 and 112b.

The next processes may be substantially the same as or similar to processes illustrated with reference to FIGS. 4 to 5.

A polysilicon layer 116 may be conformally formed on the first oxide layer 114. Thus, the polysilicon layer 116 may be formed to only partially fill the first and third trenches 110 and 112b.

The polysilicon layer 116 may serve as a diffusion barrier layer for preventing the diffusion of oxygen during a subsequent annealing process. Also, the polysilicon layer 116 may serve as a stop layer in a planarization process of a subsequently formed SOD layer 150 (refer to FIG. 19).

Figure 19:
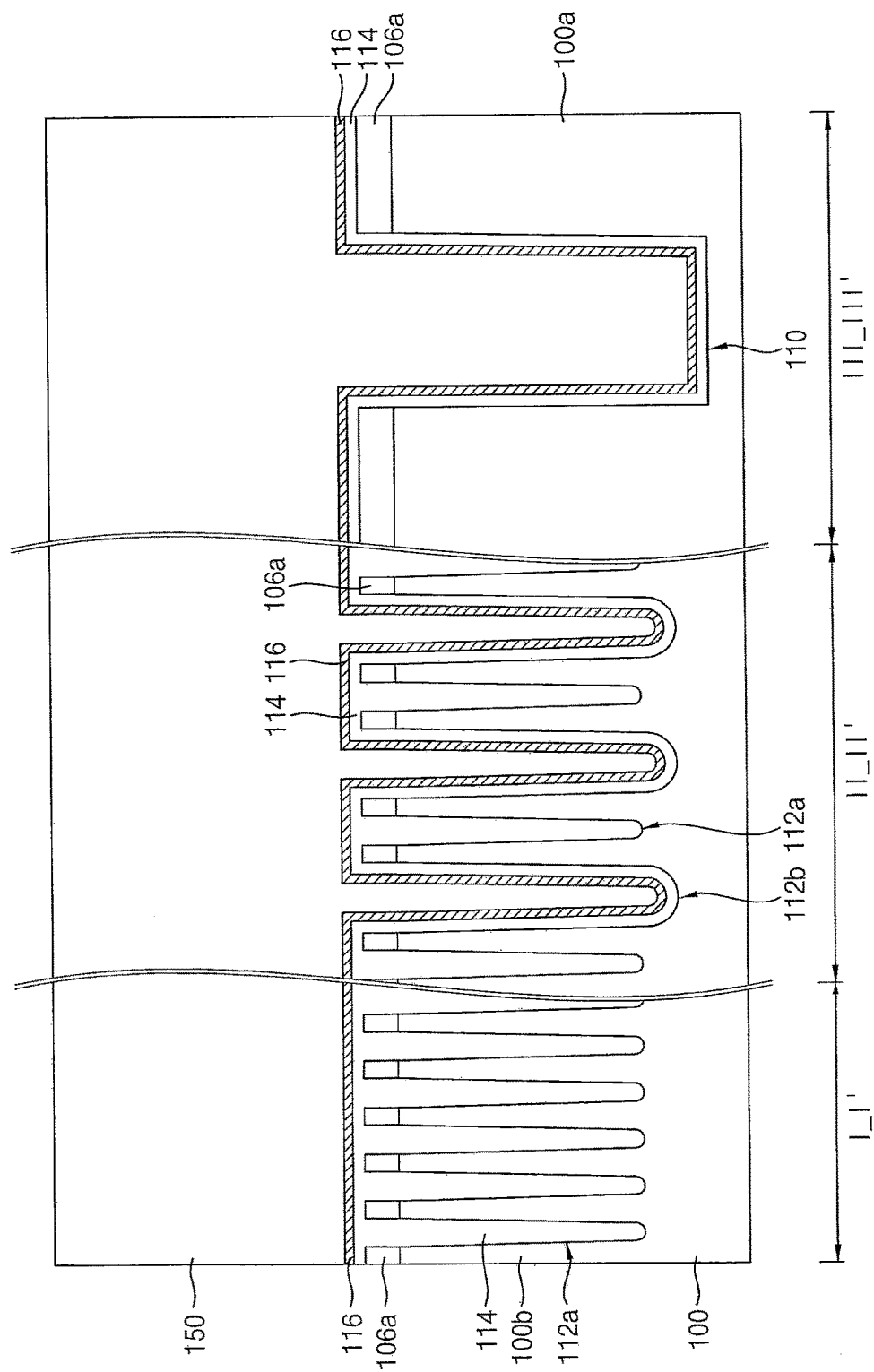

Referring to FIG. 19, an SOD layer 150 having good gap filling characteristics may be formed on the polysilicon layer 116. The SOD layer 150 may be formed by a spin coating process using polysilazane based solution. In exemplary embodiments, the SOD layer 150 may include Si—N bonds, Si—H bonds and N—H bonds, etc. The SOD layer 150 may be formed to sufficiently fill the first and third trenches 110 and 112b.

Figure 20:
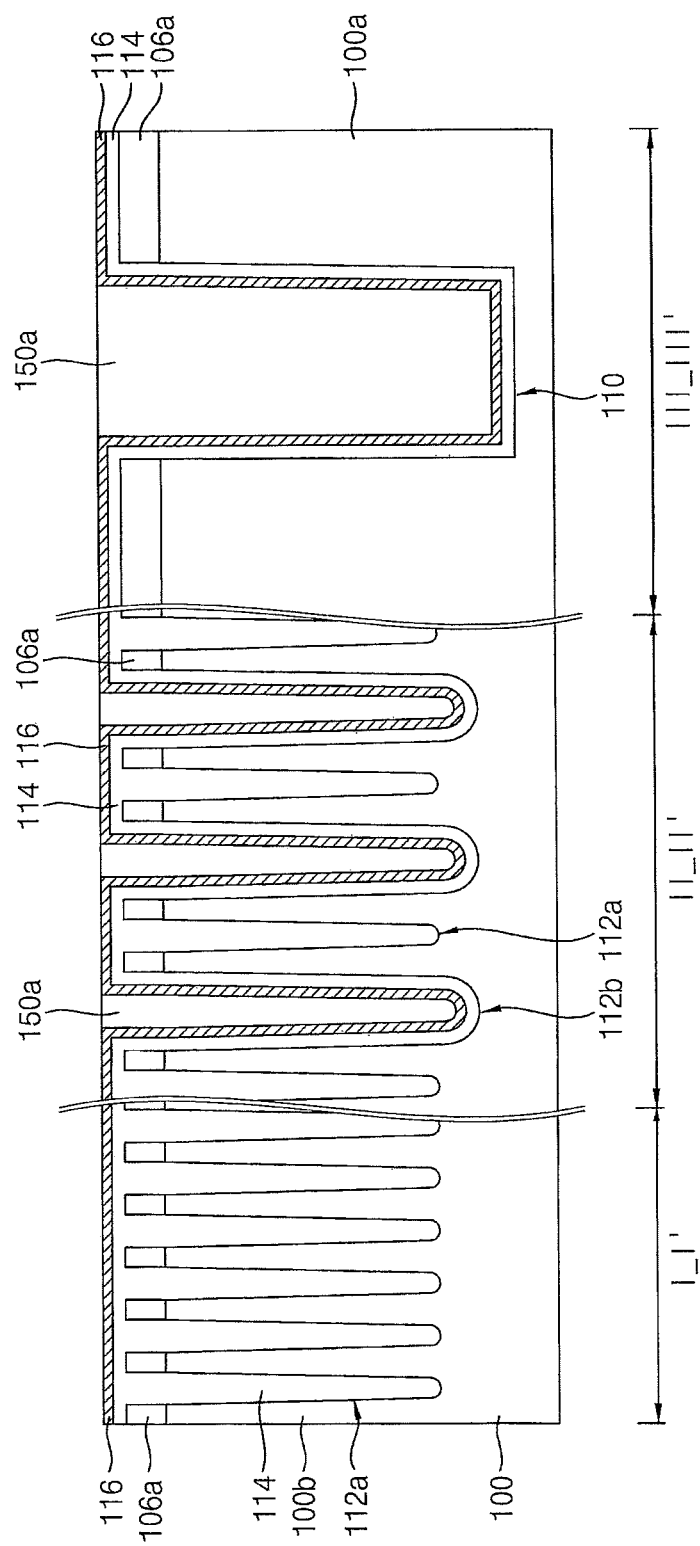

Referring to FIG. 20, the SOD layer 150 may be planarized until a top surface of the polysilicon layer 116 over the hard mask 106a may be exposed. Thus, a SOD pattern 150a may be formed in the first and third trenches 110 and 112b.

The planarization process may be performed by an etch back process and/or a CMP process. In exemplary embodiments, the polysilicon layer 116 may serve as a polish stop layer or an etch stop layer in the planarization process.

Figure 21:
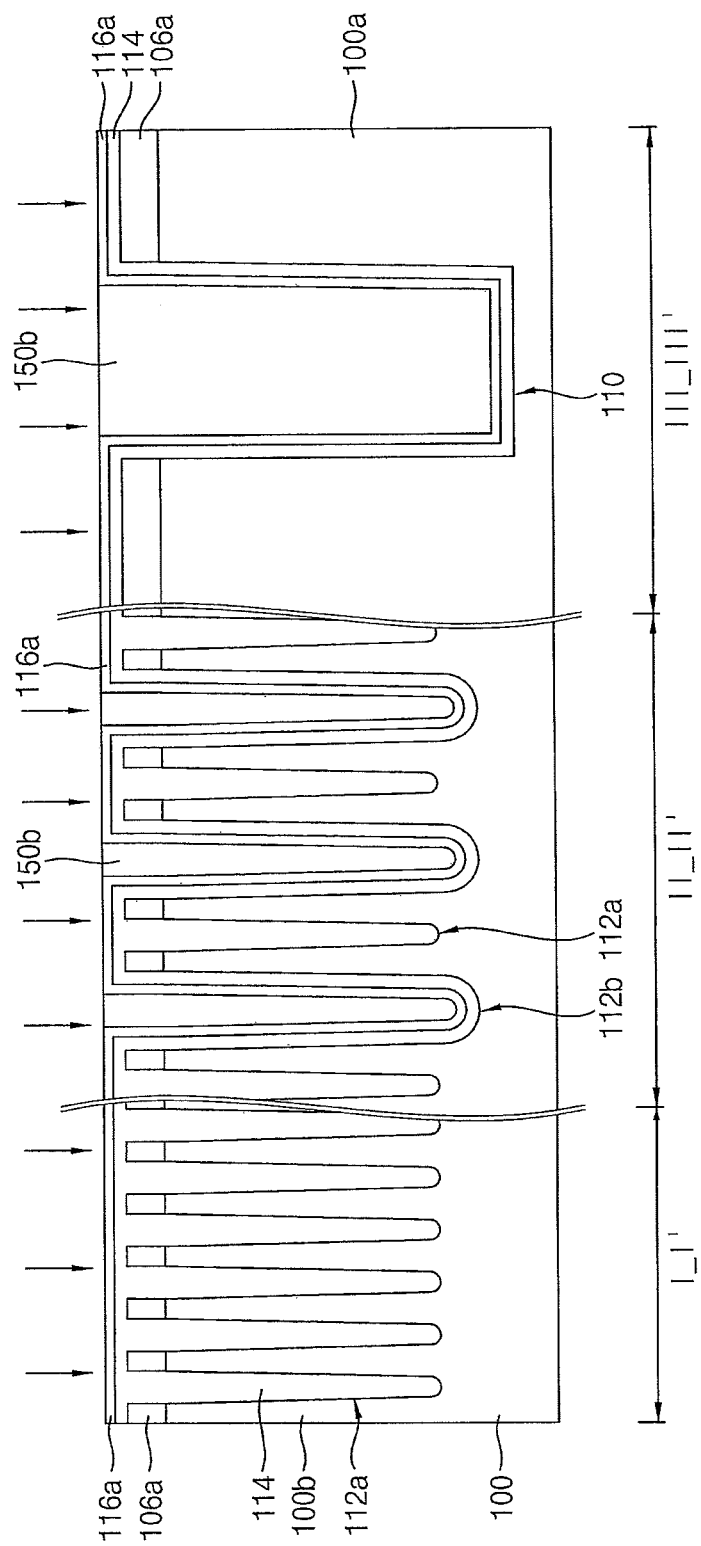

Referring to FIG. 21, an annealing process may be performed on the SOD pattern 150a and the polysilicon layer 116. Each of the SOD pattern 150a and the polysilicon layer 116 may be transformed into a silicon oxide layer by the annealing process.

The annealing process may be performed under an atmosphere of $H_2O$ or under an atmosphere of hydrogen ($H_2$) and oxygen ($O_2$). The annealing process may be performed at a temperature of about 300° C. to about 1100° C. for a period of about 30 minutes to about 120 minutes.

The Si—N bonds, Si—H bonds and N—H bonds in the SOD pattern 150a may be substituted with Si—O bonds by the annealing process, and thus a third oxide pattern 150b including silicon oxide may be formed. Also, the polysilicon layer 116 may be reacted with oxygen so that a second oxide layer 116a may be formed. Thus, the polysilicon layer 116 may be transformed completely into the second oxide layer 116a, and none of the original polysilicon layer 116 may remain in the first and third trenches 110 and 112b.

The first oxide layer 114, the second oxide layer 116a and the third oxide pattern 150b may thus be formed in the first and third trenches 110 and 112b, and the first oxide layer 114 will be formed in the second trench 112a, as shown in FIG. 21.

Upper portions of the first and second oxide layers 114 and 116a, respectively, and the third oxide pattern 150b may then be etched until a top surface of the substrate 100 may be exposed. Thus, a first oxide pattern 114a, a second oxide pattern 116a and the third oxide pattern 150b may be formed in the first and third trenches 110 and 112b, and the first oxide pattern 114a may be also formed in the second trench 112a. A MOS transistor may be formed on the first active pattern 100a, and memory cells may be formed on the second active pattern 100b in the second region of the substrate 100.

Using the processes described above, the semiconductor device of FIGS. 1A, 1B and 2 may be manufactured.

FIGS. 22 to 26 are cross-sectional views illustrating stages of a method of manufacturing a semiconductor device including an isolation structure in accordance with some exemplary embodiments. The semiconductor device of FIGS. 1A, 1B and 2 may be manufactured by processes described below, which differ in certain respects from the processes previously described for forming this semiconductor device.

Figure 22:
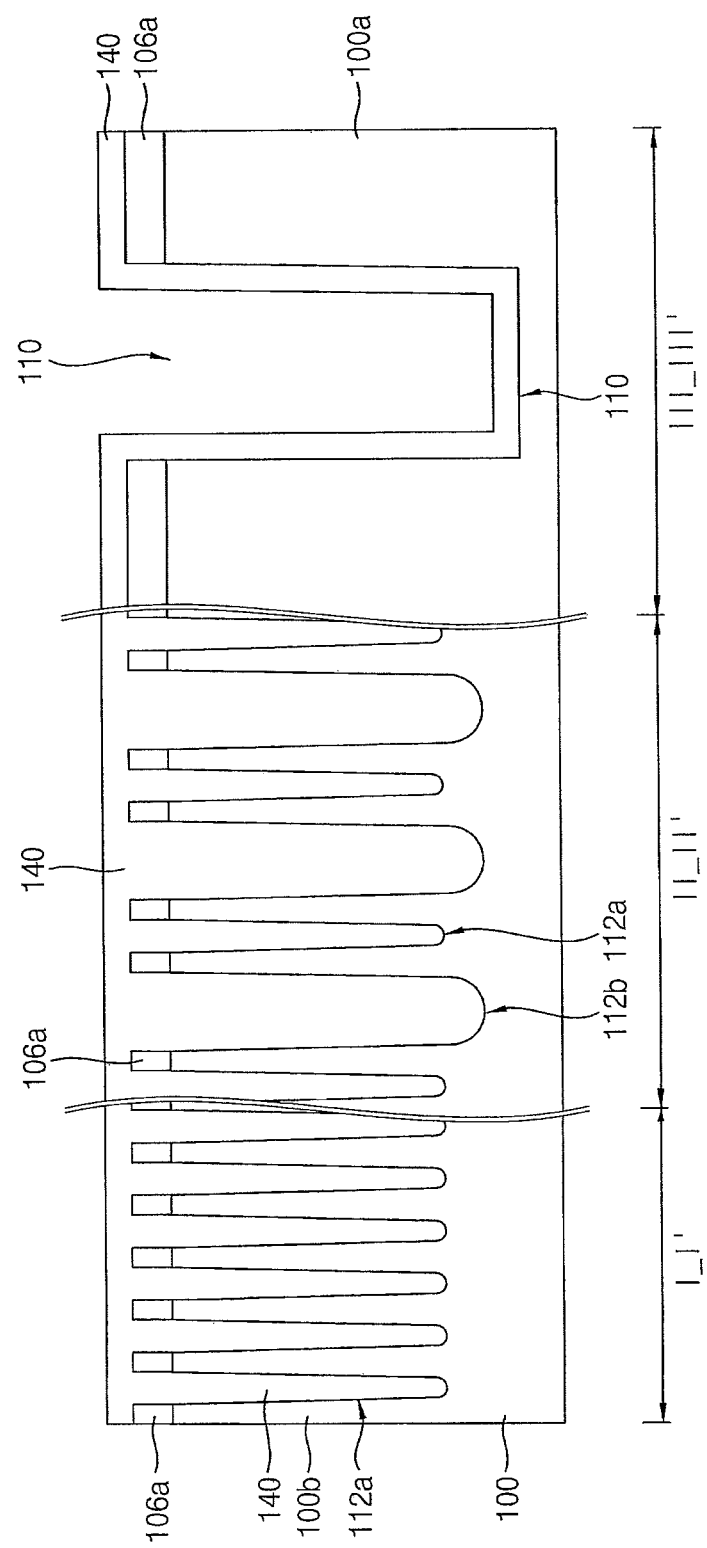

Referring to FIG. 22, a hard mask layer and a mask pattern (not shown) may be sequentially formed on a substrate 100 that includes a first region and a second region. The hard mask layer and the mask pattern may be formed by processes substantially the same as or similar to the processes illustrated with reference to FIG. 17.

The hard mask layer may be etched using the mask pattern as an etching mask to form a hard mask 106a. The substrate 100 may be etched using the hard mask 106a as an etching mask to form first active patterns 100a and second active patterns 100b. Also, a first trench 110 may be formed between the first active patterns 100a, and a second trench 112a and a third trench 112b may be formed between the second active patterns 100b.

A first oxide layer 140 may be formed on inner walls of the first and third trenches 110 and 112b, respectively, and also on a top surface of the hard mask 106a. The first oxide layer 140 may be conformally formed on the inner wall of the first trench 110. The first oxide layer 140 may be formed to only partially fill the first trench 110.

The first oxide layer 140 may be formed by a thermal oxidation process, an ALD process or a CVD process, and may be formed of an oxide, e.g., silicon oxide.

Figure 23:
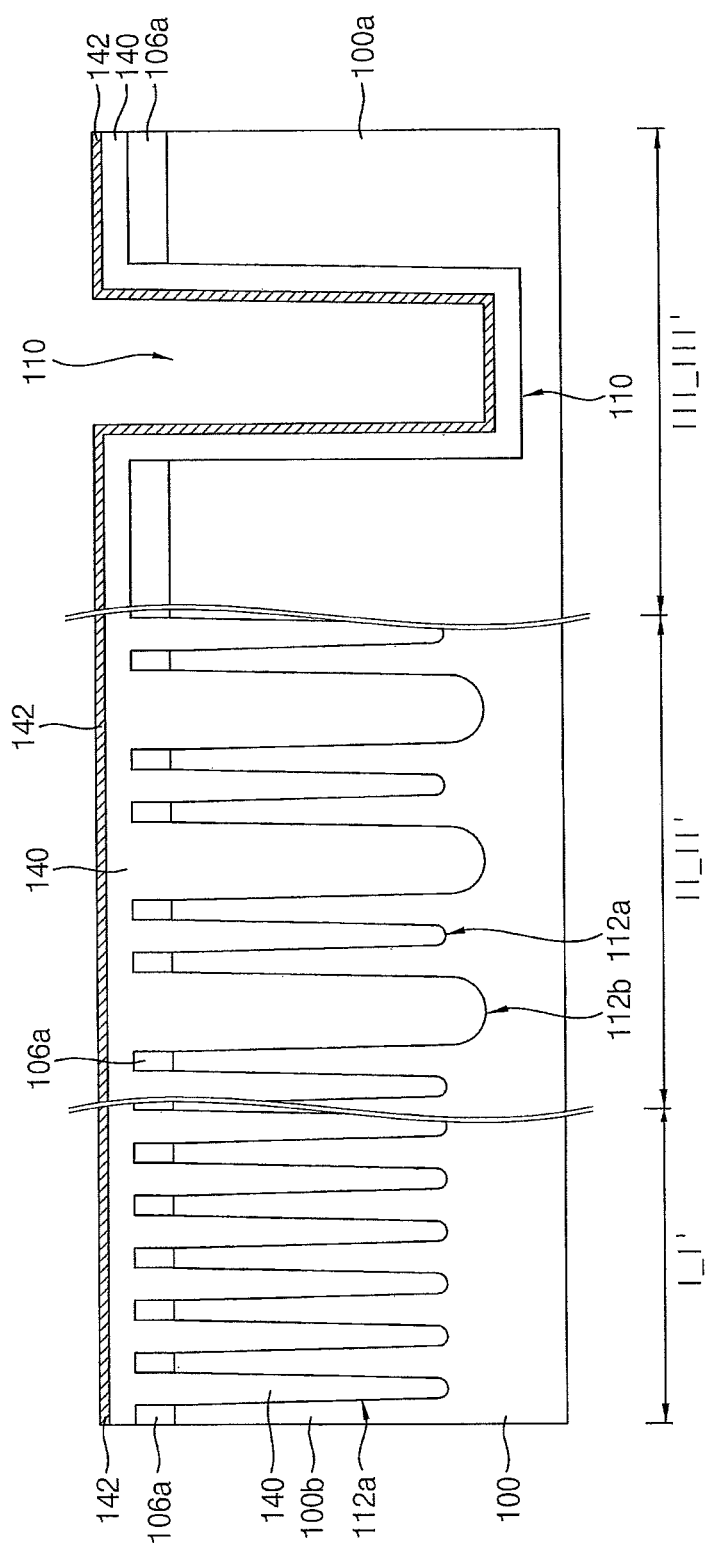

Referring to FIG. 23, a polysilicon layer 142 may be formed on first oxide layer 140. The polysilicon layer 142 may be conformally formed on the first oxide layer 140. Thus, the polysilicon layer 142 may be formed to only partially fill the first trench 110.

The first oxide layer 140 may be formed to sufficiently fill the second and third trenches 112a and 112b, respectively, so that the polysilicon layer 142 may be formed above the second and third trenches 112a and 112b.

Figure 24:
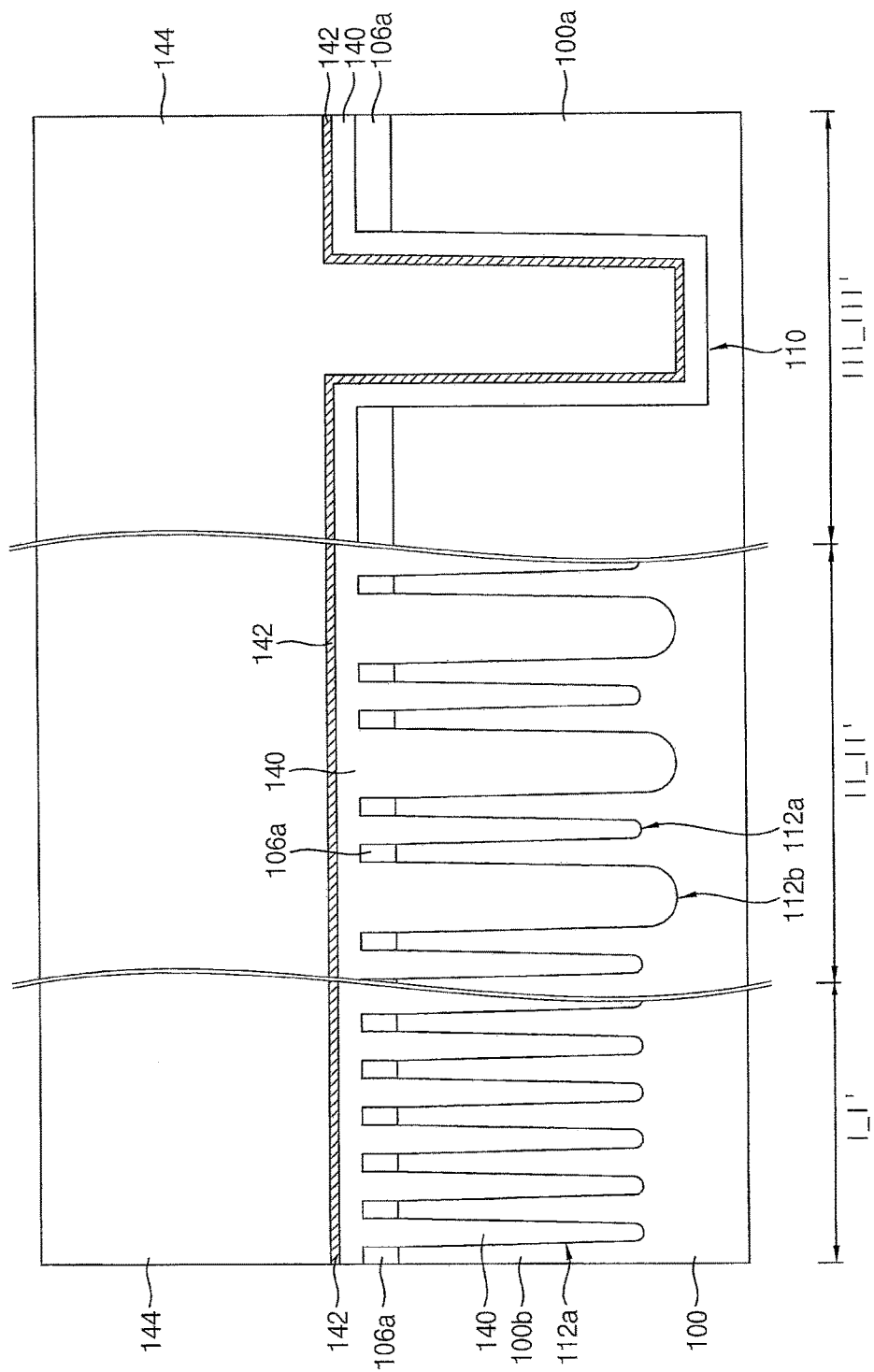

Referring to FIG. 24, a SOD layer 144 having good gap filling characteristics may be formed on the polysilicon layer 142. The SOD layer 144 may be formed by a spin coating process using polysilazane based solution. In exemplary embodiments, the SOD layer 144 may include Si—N bonds, Si—H bonds and N—H bonds, etc. The SOD layer 144 may be formed to sufficiently fill the first trench 110.

Figure 25:
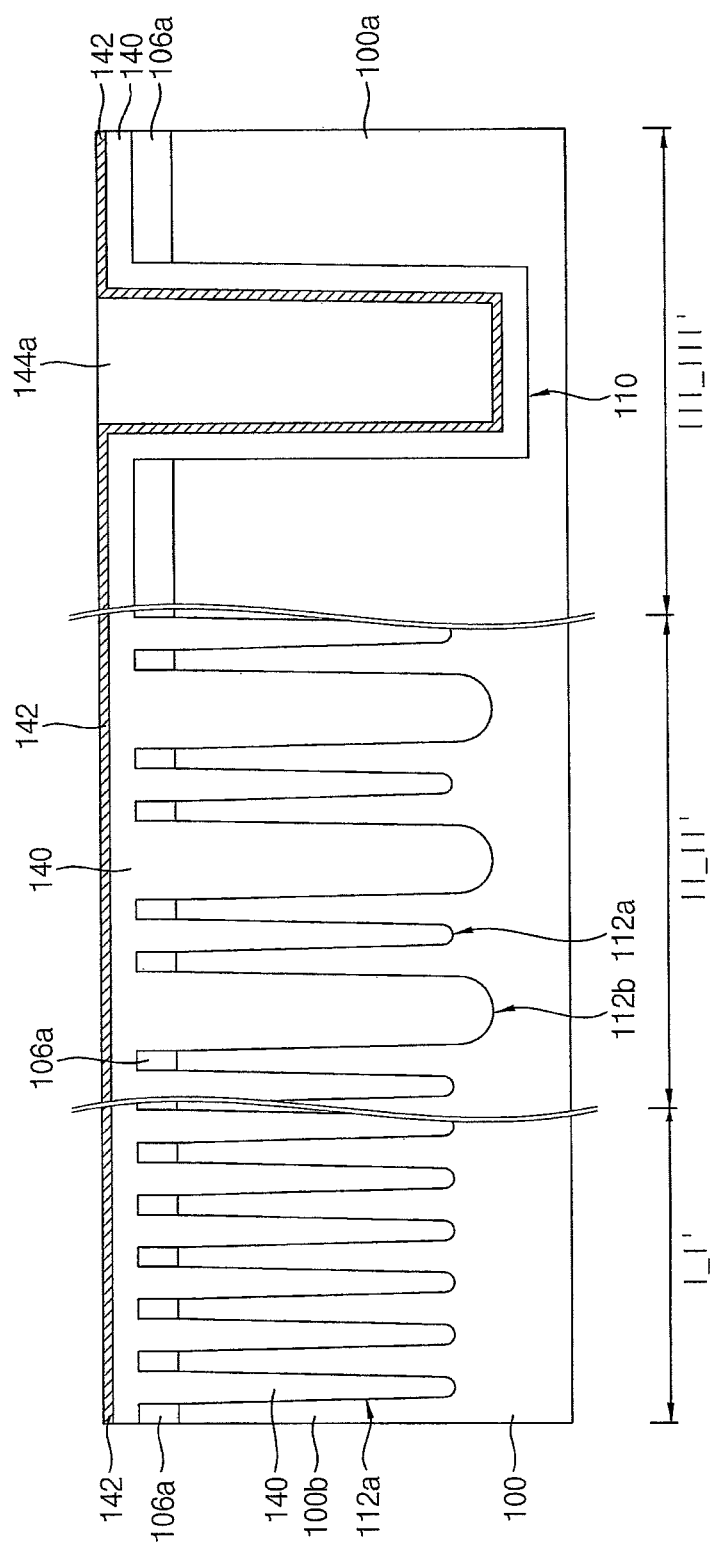

Referring to FIG. 25, the SOD layer 144 may be planarized until a top surface of the polysilicon layer 142 over the hard mask 106a may be exposed. Thus, a SOD pattern 144a may be formed in the first trench 110.

The planarization process may be performed by an etch back process and/or a CMP process. In exemplary embodiments, the polysilicon layer 142 may serve as a polish stop layer or an etch stop layer in the planarization process.

Figure 26:
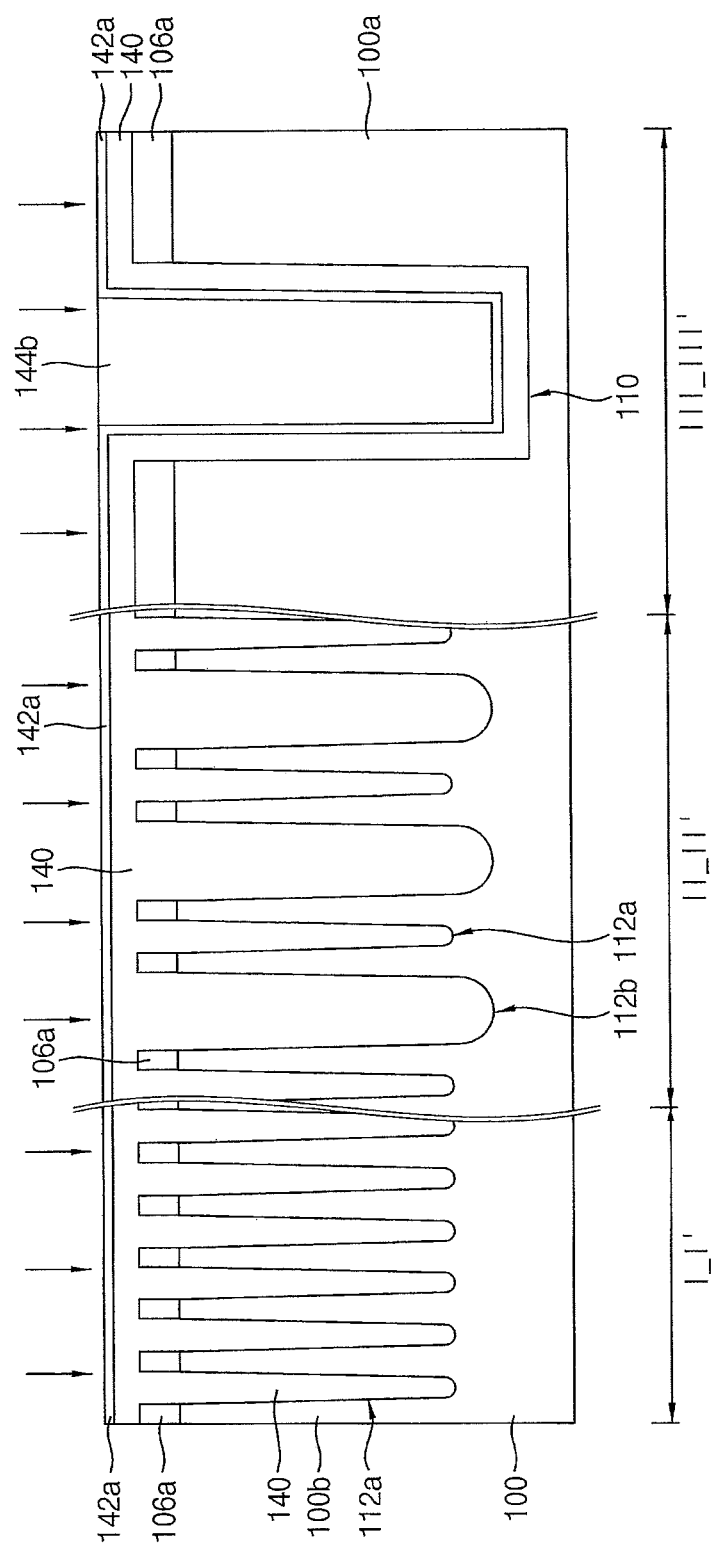

Referring to FIG. 26, an annealing process may be performed on the SOD pattern 144a and the polysilicon layer 142. Each of the SOD pattern 144a and the polysilicon layer 142 may be transformed into a silicon oxide layer by the annealing process.

The annealing process may be substantially the same as or similar to the annealing process illustrated with reference to FIG. 21. Si—N bonds, a Si—H bonds and N—H bonds in the SOD layer may be substituted with Si—O bonds by the annealing process, and thus a third oxide pattern 144b including silicon oxide may be formed. Also, the polysilicon layer 142 may be reacted with oxygen so that a second oxide layer 142a may be formed. Thus, the polysilicon layer 142 may be transformed completely into the second oxide layer 142a, and none of the original polysilicon layer 142 may remain in the first trench 110.

Upper portions of the first and second oxide layers 140 and 142a and the third oxide pattern 144b may then be etched until a top surface of the substrate 100 may be exposed. Thus, a first oxide pattern, a second oxide pattern and the third oxide pattern may be formed in the first trench 110, and the first oxide pattern may be formed in the second and third trenches 112a and 112b. Also, a MOS transistor may be formed on the first active patterns 100a, and memory cells may be formed on the second active patterns 100b.

Using the processes described above, the semiconductor device of FIGS. 11A, 11B and 12 may be manufactured.

FIGS. 27 to 30 are cross-sectional views illustrating stages of a method of manufacturing a semiconductor device including an isolation structure in accordance with some exemplary embodiments.

Figure 27:
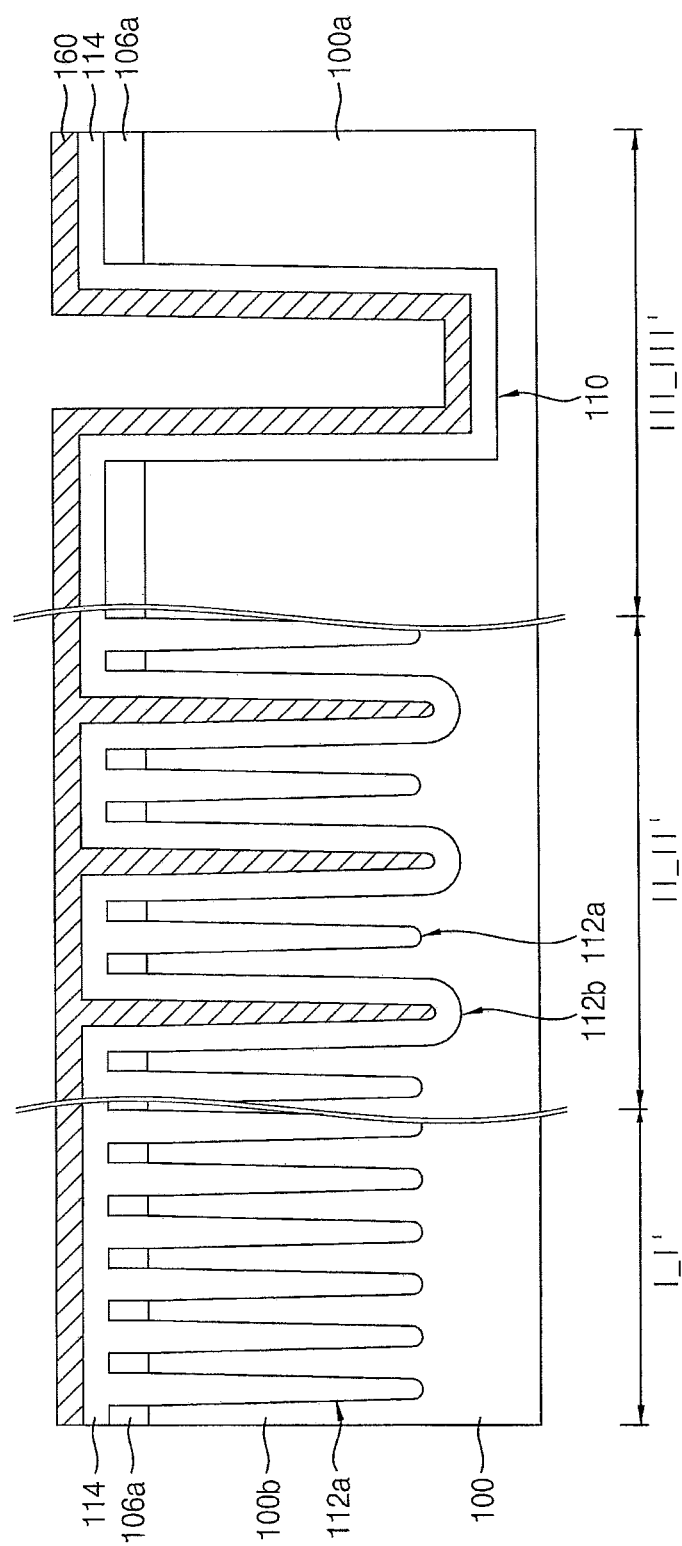

Referring to FIG. 27, a hard mask layer and a mask pattern (not shown) may be sequentially formed on a substrate 100 that includes a first region and a second region. The hard mask layer and the mask pattern may be formed by processes substantially the same as or similar to the processes illustrated with reference to FIG. 17.

The hard mask layer may be etched using the mask pattern as an etching mask to form a hard mask 106a. The substrate 100 may be etched using the hard mask 106a as an etching mask to form first active patterns 100a and second active patterns 100b. Also, a first trench 110 may be formed between the first active patterns 100a, and a second trench 112a and a third trench 112b may be formed between the second active patterns 100b.

A first oxide layer 114 may be formed to sufficiently fill the second trench 112a. The first oxide layer 114 may be conformally formed on inner walls of the first trench and third trench 110 and 112b, respectively. The first oxide layer 114 may be formed to only partially fill the first and third trenches 110 and 112b.

The first oxide layer 114 may be formed by a thermal oxidation process, an ALD process or a CVD process, and may be formed of an oxide, e.g., silicon oxide.

A polysilicon layer 160 may be formed on the first oxide layer 114. The polysilicon layer 160 may be conformally formed on the first oxide layer 114. Thus, the polysilicon layer 160 may be formed to only partially fill the first trench 110.

The polysilicon layer 160 may be formed to sufficiently fill the third trench 112b, and so that the polysilicon layer 160 may be formed above the second trench 112a. That is, the polysilicon layer 160 may be formed on the first oxide layer 114 to fill the third trench 112b.

Figure 28:
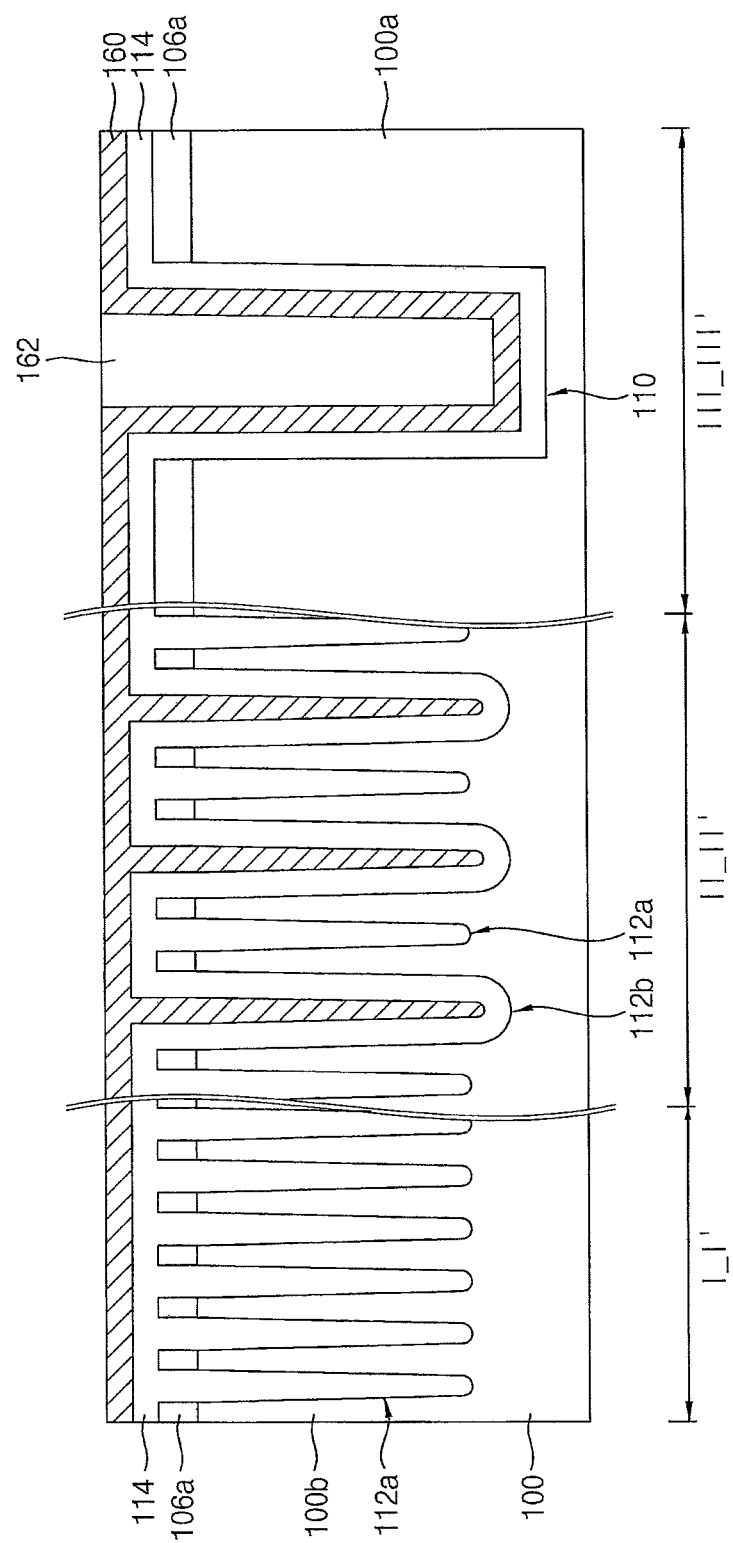

Referring to FIG. 28, an SOD layer having good gap filling characteristics may be formed on the polysilicon layer 160. The SOD layer may be formed by a spin coating process using polysilazane based solution. The SOD layer may be formed to sufficiently fill the first trench 110.

The SOD layer may then be planarized until a top surface of the polysilicon layer 160 may be exposed. Thus, a SOD pattern 162 may be formed in the first trench 110, as shown in FIG. 28.

The planarization process may be performed by an etch back process and/or a CMP process. In exemplary embodiments, the polysilicon layer 160 may serve as a polish stop layer or an etch stop layer in the planarization process.

Figure 29:
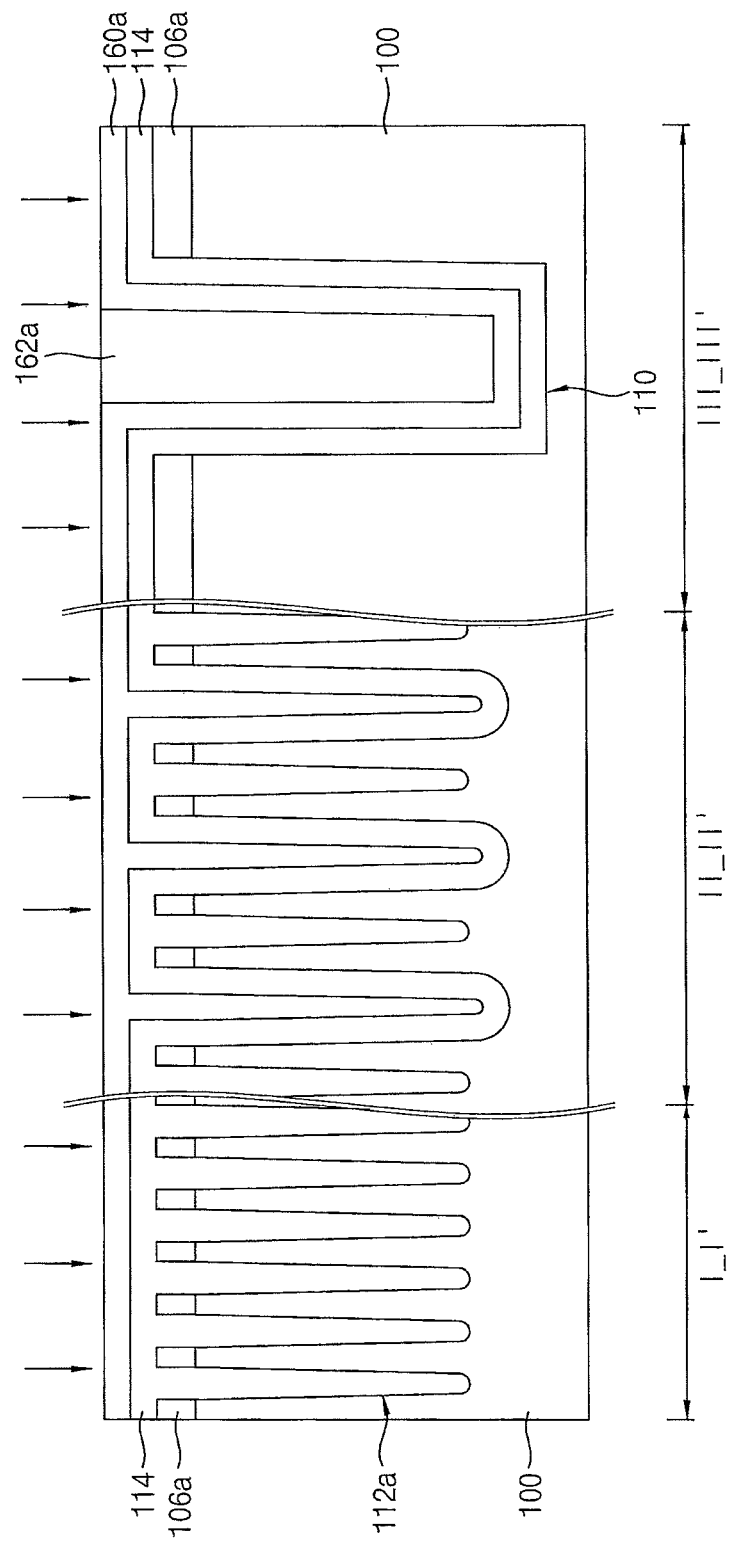

Referring to FIG. 29, an annealing process may be performed on the SOD pattern 162 and the polysilicon layer 160. Each of the SOD pattern 162 and the polysilicon layer 160 may be transformed into a silicon oxide layer by the annealing process.

The annealing process may be substantially the same as or similar to the annealing process illustrated with reference to FIG. 21. Si—N bonds, Si—H bonds and N—H bonds in the SOD pattern 162 may be substituted with Si—O bonds by the annealing process, and thus a third oxide pattern 162a including silicon oxide may be formed. Also, the polysilicon layer 160 may be reacted with oxygen so that a second oxide layer 160a may be formed. Thus, the polysilicon layer 160 may be transformed completely into the second oxide layer 160a, and none of the original polysilicon layer 160 may remain in the first and third trenches 110 and 112b.

Figure 30:
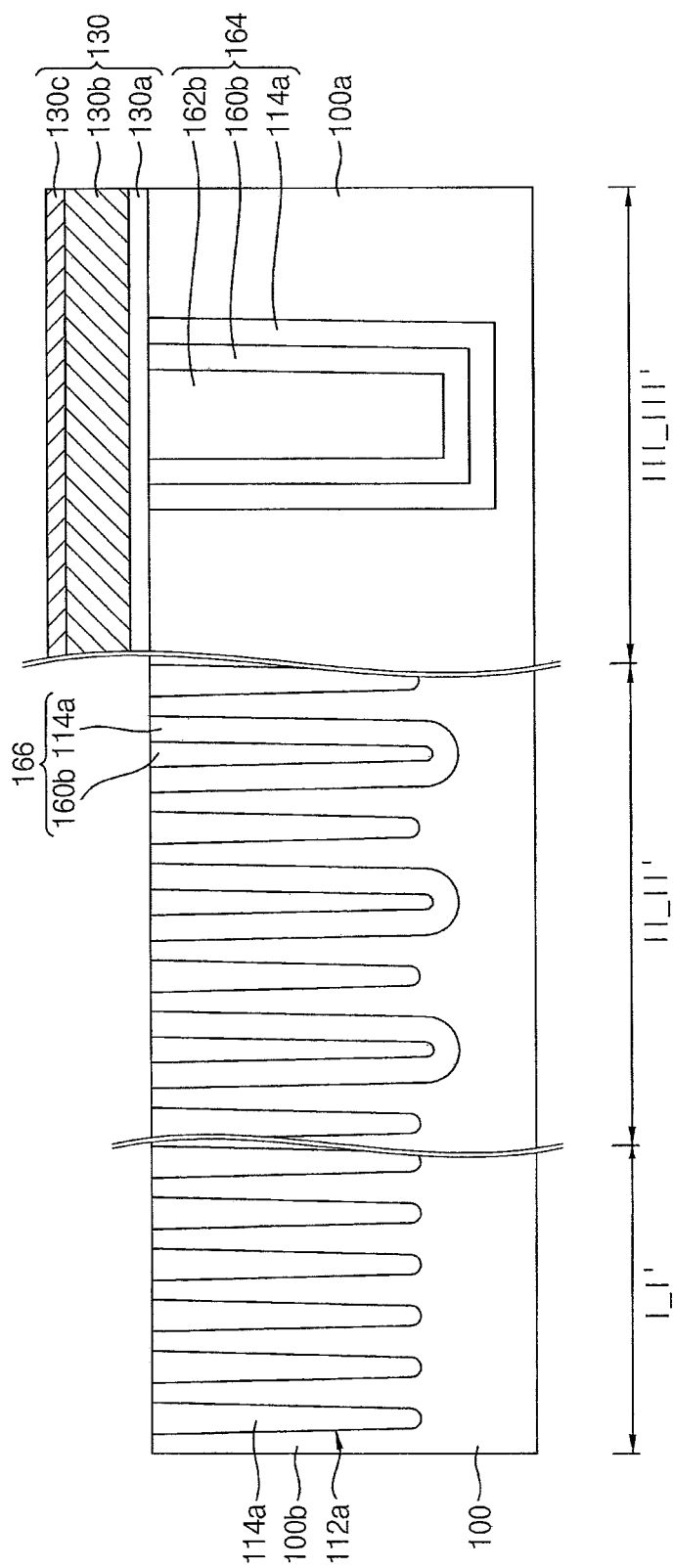

Referring to FIG. 30, upper portions of the first oxide layer 114, the second oxide layer 160a and the third oxide pattern 162a may then be etched until a top surface of the substrate 100 may be exposed. Thus, a first isolation structure 164 including the first, second and third oxide patterns 114a, 160b and 162b, respectively, may be formed in the first trench 110. The first oxide pattern 114a may be formed in the second trench 112a. A second isolation structure 166 including the first and second oxide patterns 114a and 160b may be formed in the third trench 112b. Also, a MOS transistor may be formed on the first active patterns 100a, and memory cells may be formed on the second active patterns 100b.

Thus, one or more of the first, second and third trenches 110, 112a and 112b may be filled with an isolation structure comprised of silicon oxide formed by different processes.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing an isolation structure, the method comprising:
   forming a hard mask directly on a first region and a second region of a substrate;
   etching the substrate using the hard mask as an etching mask to form a plurality of first active patterns in the first region and a plurality of second active patterns in the second region, a first trench between the first active patterns having a first trench width, and a second trench between the second active patterns having a second trench width smaller than the first trench width;
   forming a first oxide layer directly on the hard mask and directly on the first and second trenches, the first oxide layer being conformally formed on an inner wall of the first trench and filling the second trench;
   conformally forming a polysilicon layer directly on the first oxide layer;
   forming a spin-on-dielectric (SOD) layer directly on the polysilicon layer to fill the first trench; and
   forming second and third oxide layers by annealing the SOD layer and the polysilicon layer using an oxygen-containing gas so that the SOD layer and the polysilicon layer are transformed into a second oxide layer and a third oxide layer, respectively, in the first trench.

2. The method of claim 1, wherein the step of forming the SOD layer includes coating with polysilazane based solution.

3. The method of claim 1, wherein the first oxide layer includes silicon oxide formed by a chemical vapor deposition (CVD) process, an atomic layer deposition (ALD) process or a thermal oxidation process.

4. The method of claim 1, wherein the hard mask is formed of silicon oxide.

5. A method of manufacturing an isolation structure, the method comprising:
   forming a pad insulation layer directly on a first region and a second region of a substrate, forming a stop layer directly on the pad insulation layer, and forming a hard mask directly on the stop layer;
   etching the pad insulation layer and the stop layer to fatal a pad insulation pattern and a stop pattern, respectively, using the hard mask as an etching mask and to form a plurality of first active patterns in the first region and a plurality of second active patterns in the second region, a first trench between the first active patterns having a first trench width, and a second trench between the second active patterns having a second trench width smaller than the first trench width;
   forming a first oxide layer directly on the hard mask and directly on the first and second trenches, the first oxide layer being conformally formed on an inner wall of the first trench and filling the second trench;
   conformally forming a polysilicon layer directly on the first oxide layer;
   forming a spin-on-dielectric (SOD) layer directly on the polysilicon layer to fill the first trench; and
   forming second and third oxide layers by annealing the SOD layer and the polysilicon layer using an oxygen-containing gas so that the SOD layer and the polysilicon layer are transformed into a second oxide layer and a third oxide layer, respectively, in the first trench.

6. The method of claim 5, further comprising, after the step of forming the second oxide layer and the third oxide layer:
   planarizing the first oxide layer, the second oxide layer, the third oxide layer and the hard mask until the stop layer is exposed to form a first oxide pattern, a second oxide pattern and a third oxide pattern in the first trench and to form the first oxide pattern in the second trench.

7. The method of claim 5, wherein the pad insulation layer includes silicon oxide, and the stop layer includes silicon nitride or silicon oxynitride.

8. The method of claim 1, further comprising, after the step of forming the SOD layer:

planarizing the SOD layer until a top surface of the polysilicon layer is exposed to form a SOD pattern in the first trench.

9. The method of claim 1, wherein a third trench having a third trench width smaller than the first trench width and greater than the second trench width is formed between the second active patterns, the third trench and the second trench being in communication with each other, and wherein the method further comprises:

forming the first oxide layer, the polysilicon layer and the SOD layer in the third trench.

10. The method of claim 1, wherein a third trench having a third trench width smaller than the first trench width and greater than the second trench width is formed between the second active patterns, the third trench and the second trench being in communication with each other, and wherein the method further comprises forming the first oxide layer to fill the third trench.

11. A method of manufacturing a semiconductor device, the method comprising:

etching a substrate to form a first trench and a second trench, the first trench having a first trench width in a first region of the substrate, the second trench having a second trench width smaller than the first trench width in a second region of the substrate;

forming a first oxide layer directly on the first and second trenches, the first oxide layer being conformally formed directly on the first trench and filling the second trench;

conformally forming a polysilicon layer directly on the first oxide layer;

forming a SOD layer directly on the polysilicon layer to fill the first trench;

annealing the SOD layer and the polysilicon layer using an oxygen-containing gas so that the SOD layer and the polysilicon layer are transformed into a second oxide layer and a third oxide layer, respectively, in the first trench;

forming a gate structure on the substrate adjacent to the first trench; and forming a plurality of memory cells on the substrate adjacent to the second trench.

12. The method of claim 11, wherein the gate structure extends in a direction and has a substantially uniform 1 width along the direction.

13. The method of claim 5, further comprising, after the step of forming the second oxide layer and the third oxide layer:

planarizing the first oxide layer, the second oxide layer, the third oxide layer and the hard mask until a surface of the substrate is exposed to form a first oxide pattern, a second oxide pattern and a third oxide pattern in the first trench and to form the first oxide pattern in the second trench.

14. The method of claim 11, further comprising, after the step of forming the SOD layer:

planarizing the SOD layer until a top surface of the polysilicon layer is exposed to form a SOD pattern in the first trench.

15. The method of claim 11, wherein a third trench having a third trench width smaller than the first trench width and greater than the second trench width is formed, the third trench and the second trench being in communication with each other, and wherein the method further comprises:

forming the first oxide layer to fill the third trench.

* * * * *